(12) United States Patent
Iizuka et al.

(10) Patent No.: US 8,237,180 B2
(45) Date of Patent: Aug. 7, 2012

(54) LIGHT EMITTING ELEMENT INCLUDING CENTER ELECTRODE AND THIN WIRE ELECTRODE EXTENDING FROM PERIPHERY OF THE CENTER ELECTRODE

(75) Inventors: Kazuyuki Iizuka, Hitachi (JP); Masahiro Arai, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 256 days.

(21) Appl. No.: 12/656,176

(22) Filed: Jan. 20, 2010

(65) Prior Publication Data

US 2010/0207146 A1    Aug. 19, 2010

(30) Foreign Application Priority Data

Feb. 18, 2009    (JP) .................... 2009-035823

(51) Int. Cl.
  *H01L 27/15* (2006.01)
(52) U.S. Cl. .................... 257/95; 257/E33.07
(58) Field of Classification Search .......... 257/91, 257/94, 95, E33.07, E33.074
See application file for complete search history.

(56) References Cited

U.S. PATENT DOCUMENTS

2005/0110037 A1    5/2005  Takeda et al.
2007/0200120 A1*   8/2007  Li et al. ................ 257/79

FOREIGN PATENT DOCUMENTS

JP    2005-175462    6/2005

* cited by examiner

*Primary Examiner* — Thomas L Dickey
(74) *Attorney, Agent, or Firm* — McGinn IP Law Group, PLLC

(57) ABSTRACT

A light emitting element includes a semiconductor laminated structure including a first semiconductor layer of first conductivity type, a second semiconductor layer of second conductivity type different from the first conductivity type, and an active layer sandwiched between the first semiconductor layer and the second semiconductor layer, a surface electrode including a center electrode disposed on one surface of the semiconductor laminated structure and a thin wire electrode extending from a periphery of the center electrode, and a contact part disposed on a part of another surface of the semiconductor laminated structure extruding a part located directly below the surface electrode, in parallel along the thin wire electrode, and including a plurality of first regions forming the shortest current pathway between the thin wire electrode and a second region allowing the plural first regions to be connected. The surface electrode has an arrangement that the shortest current pathway between the center electrode and the contact part is longer than the shortest current pathway between the thin wire electrode and the first region, and the shortest current pathway between an end part of the thin wire electrode and the contact part is not shorter than the shortest current pathway between the thin wire electrode and the first region.

11 Claims, 20 Drawing Sheets

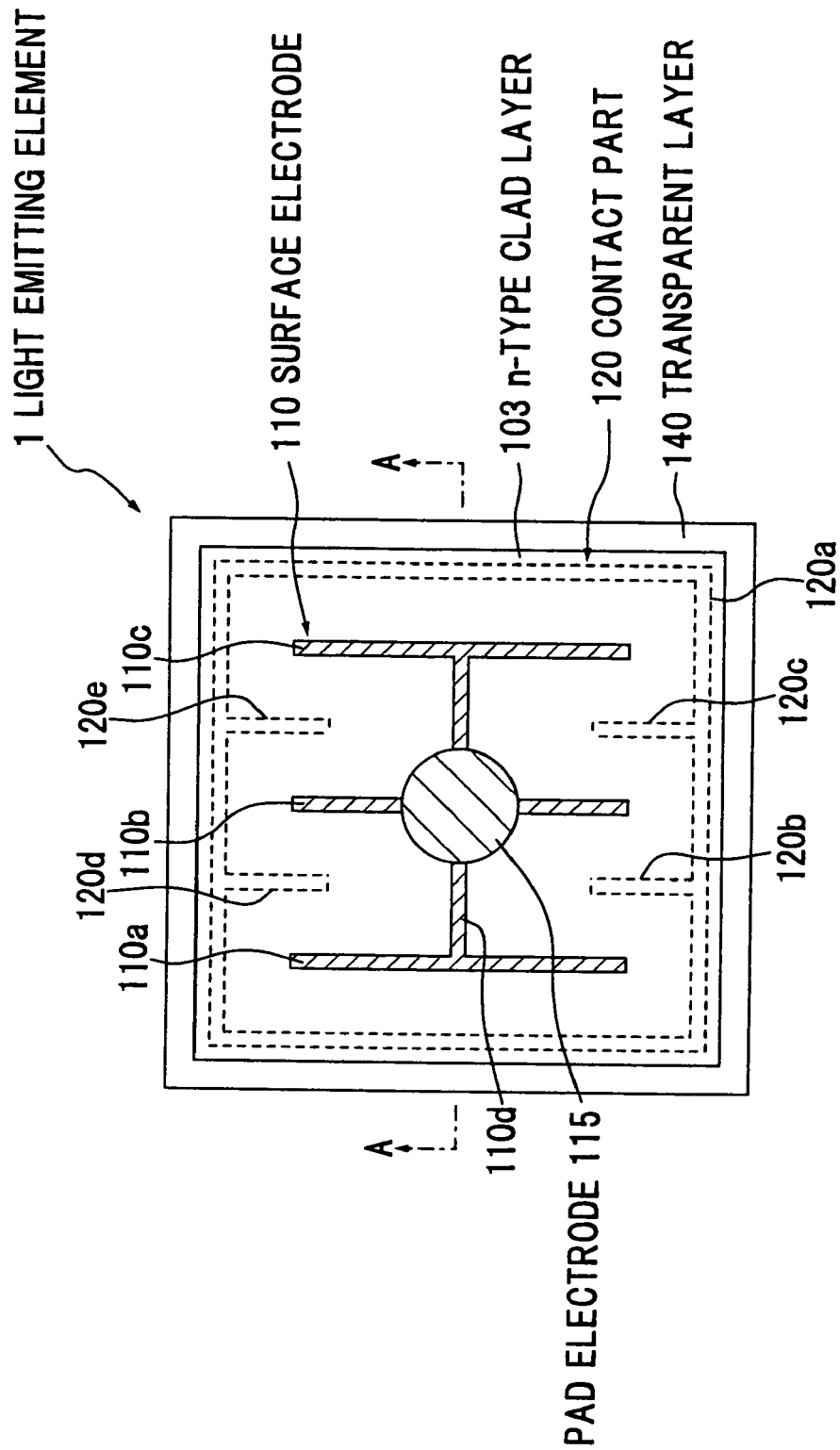

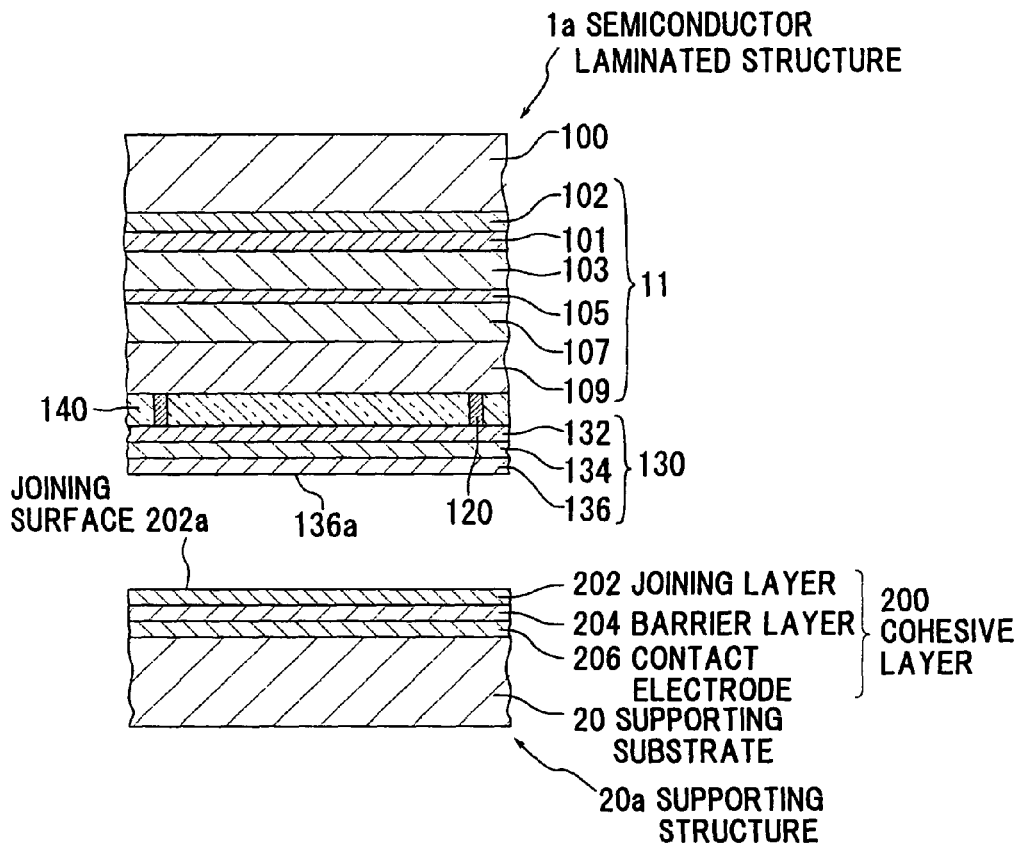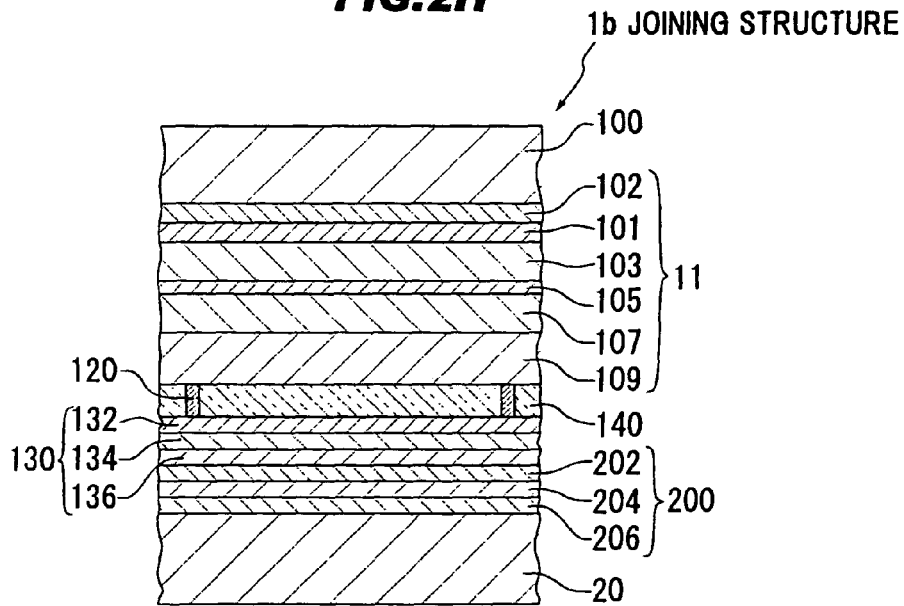

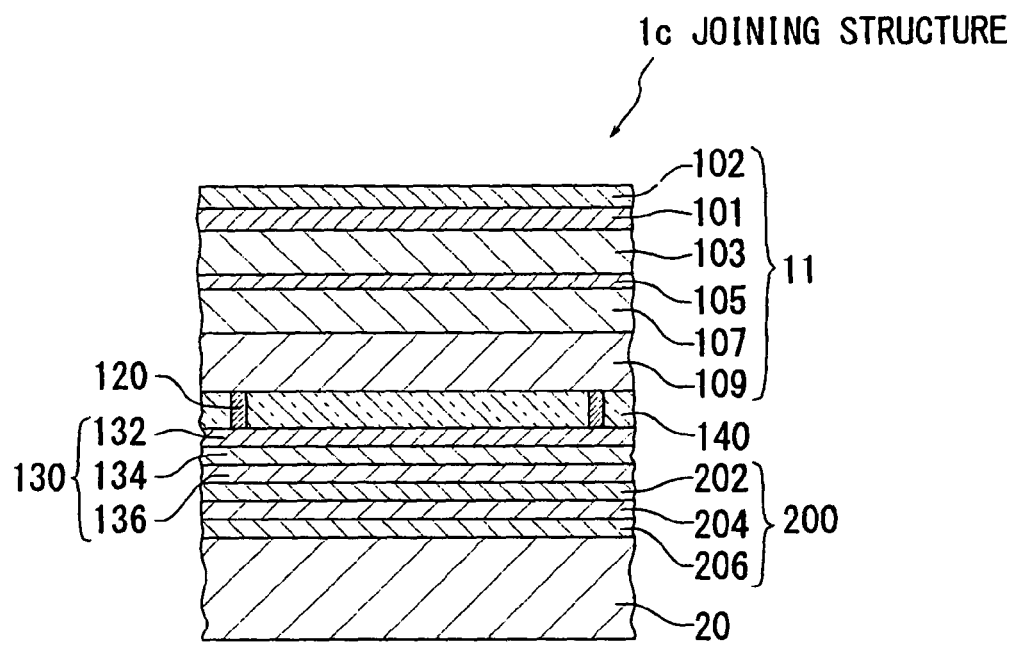
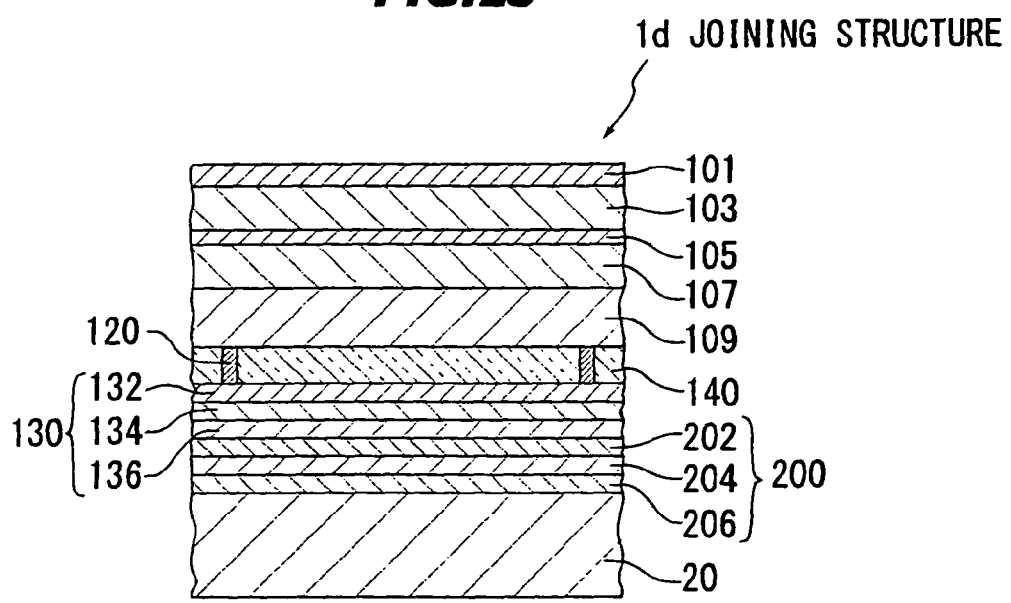

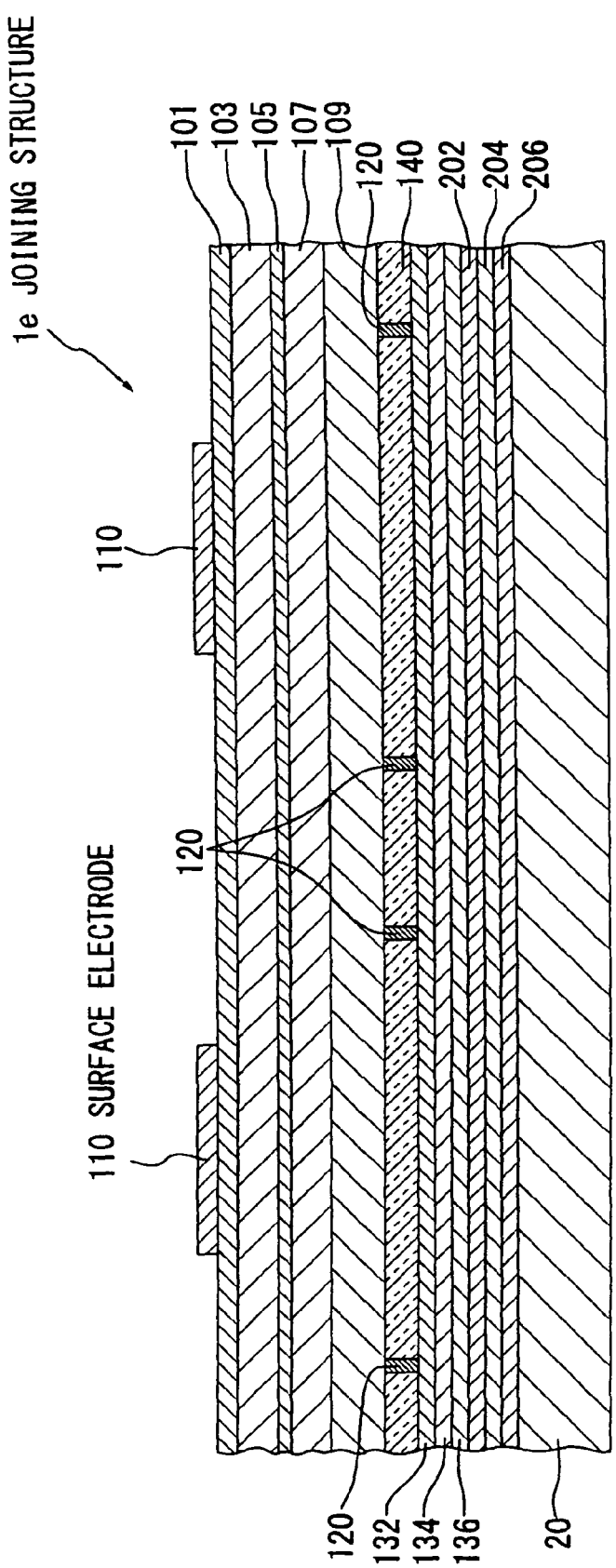

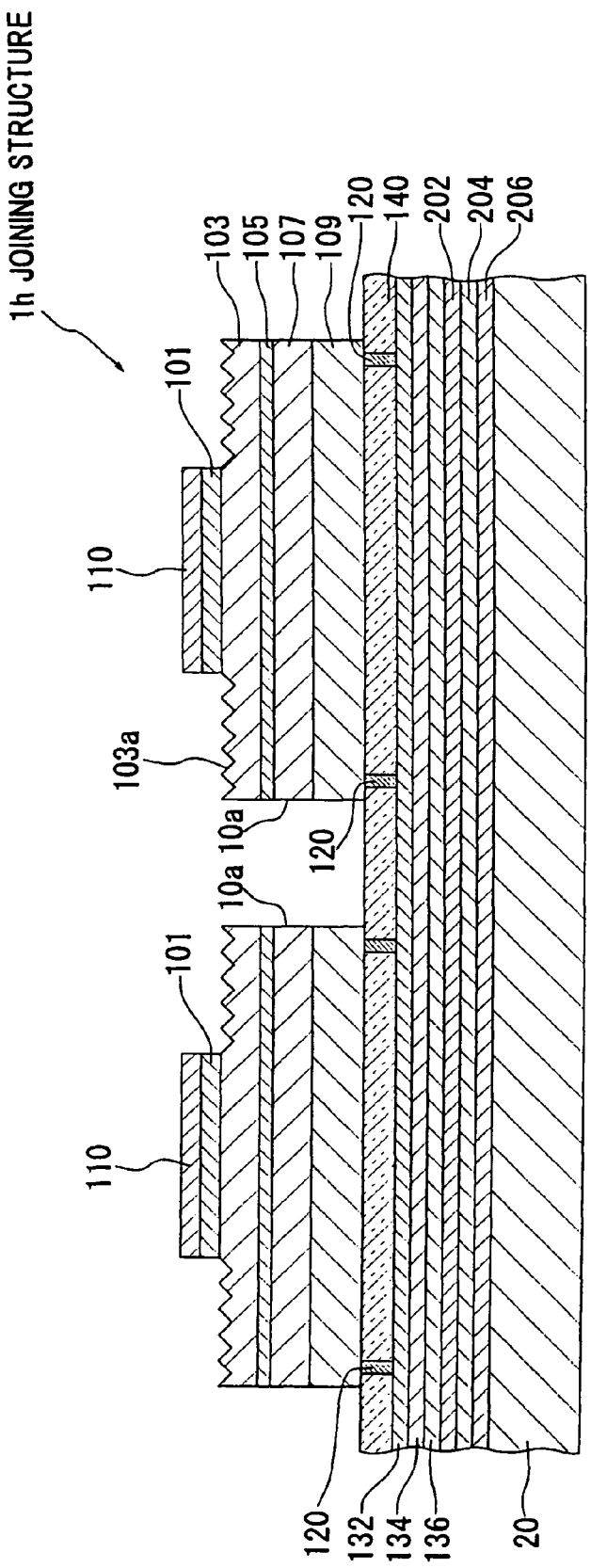

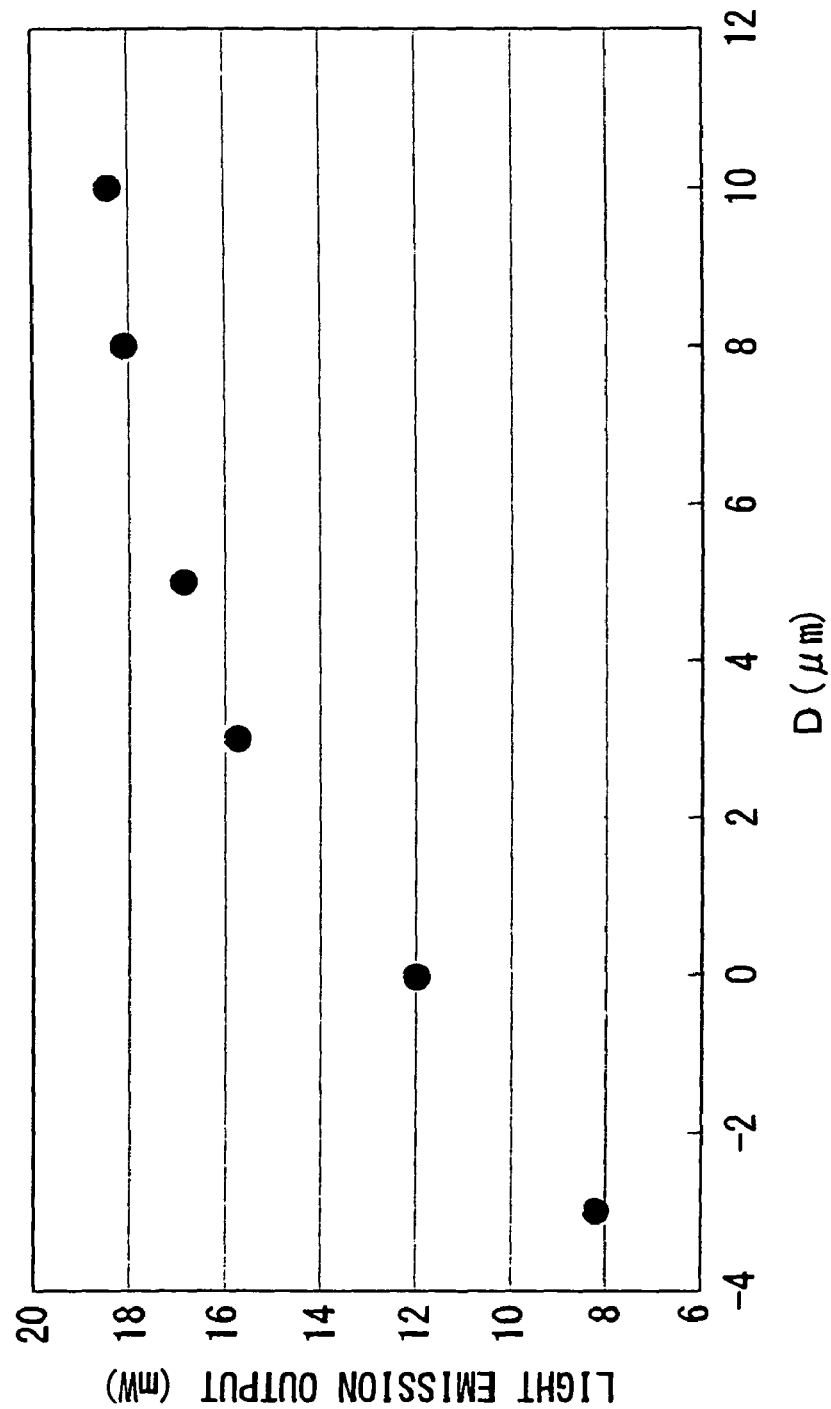

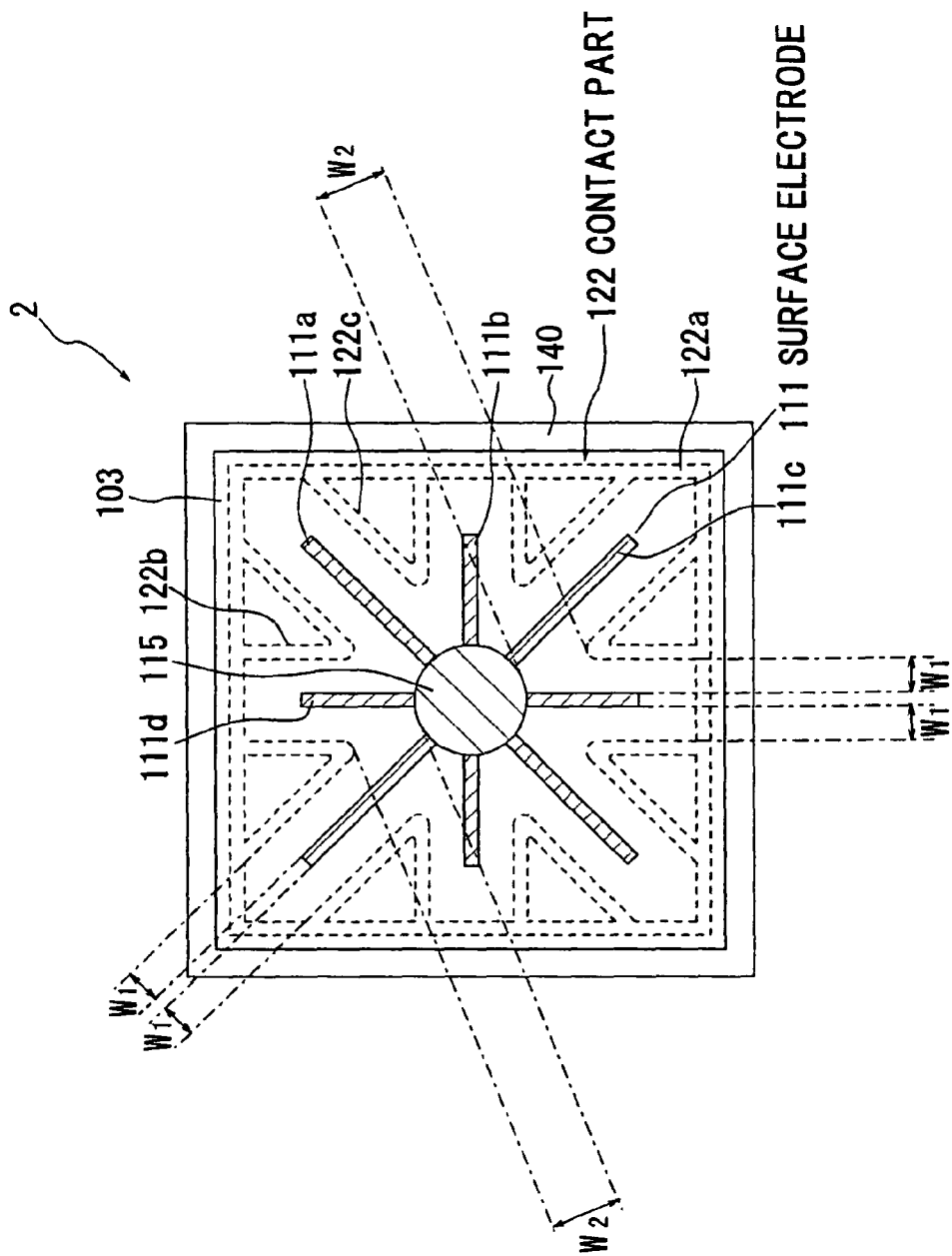

LIGHT EMITTING ELEMENT INCLUDING CENTER ELECTRODE AND THIN WIRE ELECTRODE EXTENDING FROM PERIPHERY OF THE CENTER ELECTRODE

The present application is based on Japanese patent application No. 2009-035823 filed on Feb. 18, 2009, the entire contents of which are incorporated herein by reference.

BACKGROUND OF THE INVENTION

1. Field of the Invention

This invention relates to a light emitting element and, in particular, to a light emitting element having a high light output.

2. Description of the Related Art

Conventionally, a light emitting element is known including a silicon support substrate having an anode electrode on one surface thereof, a metallic light reflecting layer formed on another surface of the silicon support substrate, a light transmission membrane formed on the metallic light reflecting layer and forming an ohmic contact with the metallic light reflecting layer, a semiconductor laminated structure formed on the light transmission membrane and having an active layer sandwiched between a p-type semiconductor layer and a n-type semiconductor layer which form an ohmic contact with the light transmission membrane, and a cathode electrode formed on the semiconductor laminated structure. The related art to the invention is, e.g., JP-A-2005-175462.

The light emitting element disclosed in JP-A-2005-175462 has a structure that a light transmission membrane having electrical conductivity is disposed between a semiconductor laminated structure and a metallic light reflecting layer so as to form an ohmic contact with both of the semiconductor laminated structure and the metallic light reflecting layer and prevent an alloying between the semiconductor laminated structure and the metallic light reflecting layer, so that a metallic light reflecting layer having an excellent in light reflecting property can be realized and a light emitting element having an enhanced light emission efficiency can be provided.

However, the light emitting element disclosed in JP-A-2005-175462 has a limit to an enhancement of light output thereof, since the same amount of current is supplied to an active layer located directly below a cathode electrode as the amount of current supplied to a part of the active layer excluding a region located directly below the cathode electrode, and consequently, a light emitted from the active layer located directly below the cathode electrode is absorbed into the cathode electrode.

SUMMARY OF THE INVENTION

Therefore, it is an object of the invention to provide a light emitting element that is capable of enhancing a light output thereof.

(1) According to One Embodiment of the Invention, a Light Emitting Element Comprises:

a semiconductor laminated structure comprising a first semiconductor layer of first conductivity type, a second semiconductor layer of second conductivity type different from the first conductivity type and an active layer sandwiched between the first semiconductor layer and the second semiconductor layer;

a surface electrode comprising a center electrode disposed on one surface of the semiconductor laminated structure and a thin wire electrode extending from a periphery of the center electrode; and a contact part disposed on a part of another surface of the semiconductor laminated structure extruding a part located directly below the surface electrode, in parallel along the thin wire electrode, and comprising a plurality of first regions forming the shortest current pathway between the thin wire electrode and a second region allowing the plural first regions to be connected, wherein the surface electrode has an arrangement that the shortest current pathway between the center electrode and the contact part is longer than the shortest current pathway between the thin wire electrode and the first region, and the shortest current pathway between an end part of the thin wire electrode and the contact part is not shorter than the shortest current pathway between the thin wire electrode and the first region.

In the above embodiment (1), the following modifications and changes can be made.

(i) A square root of sum of square of film thickness of the semiconductor laminated structure and square of the shortest distance between the center electrode and the contact part in top view is larger than a square root of sum of square of film thickness of the semiconductor laminated structure and square of the shortest distance between the thin wire electrode and the contact part in top view.

(ii) The light emitting element further comprises a supporting substrate having a reflecting layer for reflecting a light emitted from the active layer; and a transparent layer disposed between the reflecting layer and the semiconductor laminated structure, wherein the semiconductor laminated structure is supported by the supporting substrate via the transparent layer; and the contact part passes through the transparent layer and allows the semiconductor laminated structure and the reflecting layer to be electrically connected together.

(iii) The semiconductor laminated structure has a concavo-convex shape part of not less than 100 nm in arithmetic average roughness disposed on a part of the one surface thereof.

(iv) A part of the semiconductor laminated structure is removed from the one surface to the another surface thereof a part of the contact part is externally exposed due to the removal of the part of the semiconductor laminated structure; and a second pad electrode is disposed on the part of the contact part externally exposed.

Points of the Invention

According to one embodiment of the invention, a light emitting element is constructed such that a surface electrode and a contact part have a positional relationship that the shortest current pathway between the circular electrode of the surface electrode and the contact part in top view is longer than the shortest current pathway between a thin wire electrode of the surface electrode and the contact part in top view. Thereby, electrical current supplied to a pad electrode is preferentially transmitted from the thin wire electrode of the surface electrode to the contact part. Due to this, light emission directly under the pad electrode in top view where light is most absorbed can be reduced, so that the light emitting element can be enhanced in light extraction efficiency and in light output.

BRIEF DESCRIPTION OF THE DRAWINGS

The preferred embodiments according to the invention will be explained below referring to the drawings, wherein:

FIG. 1A is a top view schematically showing a light emitting element in a first embodiment according to the invention;

FIG. 3 is a graph schematically showing a light output due to difference of the value of D of the light emitting element;

FIG. 4 is a top view schematically showing a light emitting element in a second embodiment according to the invention;

DETAILED DESCRIPTION OF THE PREFERRED EMBODIMENTS

First Embodiment

Figure 1B:
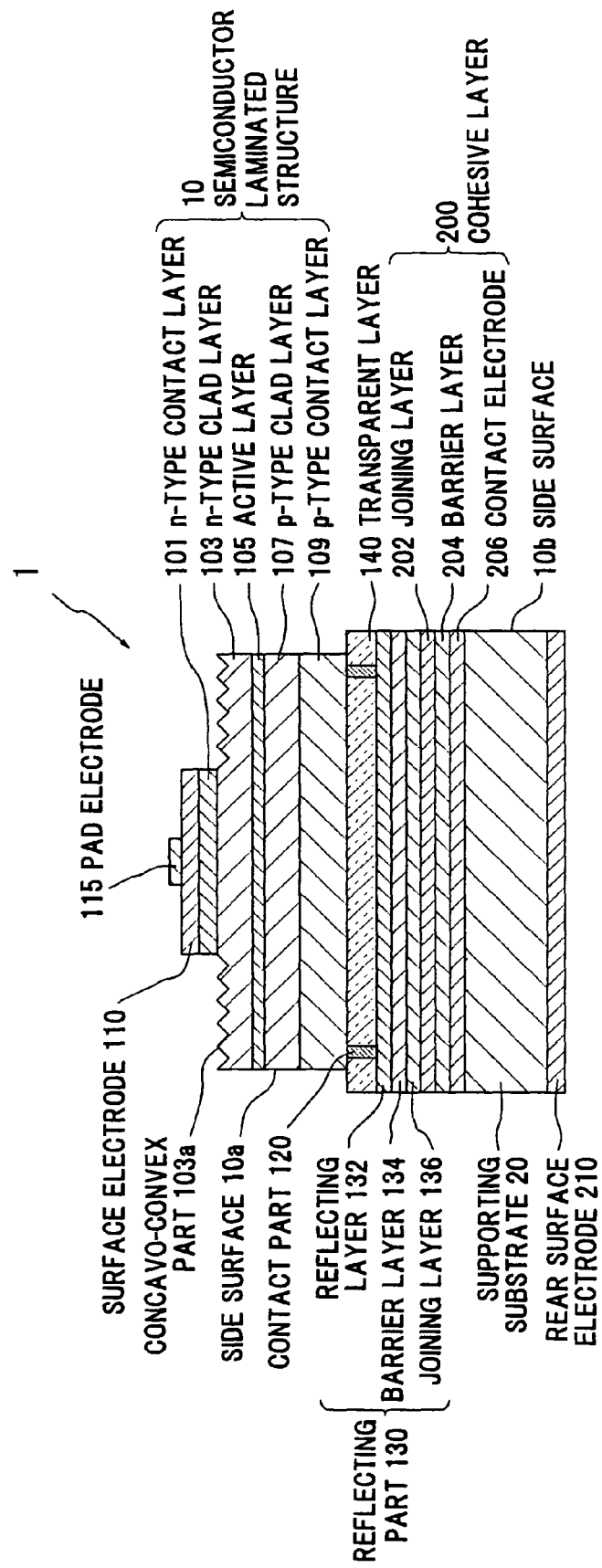
FIG. 1B is a longitudinal cross-sectional view schematically showing the light emitting element in the first embodiment according to the invention.

FIG. 1A is a top view schematically showing a light emitting element in a first embodiment according to the invention. And, FIG. 1B is a longitudinal cross-sectional view schematically showing the light emitting element in the first embodiment according to the invention. Further, FIG. 1B is a cross-sectional view taken along the line A-A in FIG. 1A.

Outline of Structure of Light Emitting Element 1

First, FIG. 1B is referred. The light emitting element 1 according to the first embodiment includes a semiconductor laminated structure 10 having an active layer 105 emitting a light having a predetermined wavelength, a surface electrode 110 electrically connected to a part of one surface of the semiconductor laminated structure 10, a pad electrode 115 disposed on a surface of the surface electrode 110 as a pad for wire bonding, a contact part 120 electrically connected to a part of another surface of the semiconductor laminated structure 10, a transparent layer 140 disposed on a part of the another surface of the semiconductor laminated structure 10 excluding a region where a contact part 120 is disposed, and a reflecting part 130 disposed on surfaces of the contact part 120 and the transparent layer 140 opposite to surfaces contacting the semiconductor laminated structure 10.

Further, the light emitting element 1 includes a cohesive layer 200 having electrical conductivity disposed on a surface of the reflecting part 130 opposite to a surface contacting the contact part 120 and the transparent layer 140, a supporting substrate 20 having electrical conductivity disposed on a surface of the cohesive layer 200 opposite to a surface contacting the reflecting part 130, and a rear surface electrode 210 disposed on a surface of the supporting substrate 20 opposite to a surface contacting the cohesive layer 200.

Also, the semiconductor laminated structure 10 of the light emitting element 1 according to the embodiment includes a p-type contact layer 109 disposed so as to contact the contact part 120 and the transparent layer 140, a p-type clad layer 107 disposed on a surface of the p-type contact layer 109 opposite to a surface contacting the transparent layer 140 as a second semiconductor layer of second conductivity type, a active layer 105 disposed on a surface of the p-type clad layer 107 opposite to a surface contacting the p-type contact layer 109, a n-type clad layer 103 disposed on a surface of the active layer 105 opposite to a surface contacting the p-type clad layer 107 as a first semiconductor layer of first conductivity type, and n-type contact layer 101 disposed on a part of the n-type clad layer 103 opposite to a surface contacting the active layer 105.

A surface of the semiconductor laminated structure 10 opposite to a surface contacting the transparent layer 140 forms a light taking-out surface of the light emitting element 1 according to the embodiment. Particularly, a part of a surface of the n-type clad layer 103 opposite to a surface contacting the active layer 105 forms the light taking-out surface. Additionally, a concavo-convex shape part 103a having a series of concavo-convex parts having one concave portion and one convex portion as one pair is formed on the light taking-out surface of the n-type clad layer 103. For example, one concave portion and another concave portion, or one convex portion and another convex portion are formed on the surface of the n-type clad layer 103 at predetermined intervals, so that the concavo-convex part 103a is formed on the n-type clad layer 103. The concavo-convex part 103a used in the embodiment is formed, for example, so as to have concavity and convexity of not less than 100 nm in arithmetic average roughness.

Further, the reflecting part 130 includes a reflecting layer 132 disposed so as to contact surfaces of the contact part 120 and the transparent layer 140, a barrier layer 134 disposed so as to contact a surface of the reflecting layer 132 opposite to a surface contacting the contact part 120 and the transparent layer 140, and a joining layer 136 disposed so as to contact a surface of the barrier layer 134 opposite to a surface contacting the reflecting layer 132. Also, the cohesive layer 200 includes a joining layer 202 mechanically and electrically connected to the joining layer 136 of the reflecting part 130, a barrier layer 204 disposed on a surface of the joining layer 202 opposite to a surface contacting the reflecting part 130, and a contact electrode 206 disposed on a surface of the barrier layer 204 opposite to a surface contacting the joining layer 202.

Here, the light emitting element 1 includes a side surface 10a as an etching side surface having a side surface of the active layer 105. Particularly, the light emitting element 1 includes the side surface 10a having side surfaces of the n-type clad layer 103, the active layer 105, the p-type clad layer 107, and the p-type contact layer 109. Also, the side surface 10a is formed so as to be perpendicular to a surface of the supporting substrate 20. Further, the light emitting element 1 includes a side surface 10b as a processing side surface having side surfaces of the reflecting part 130, the cohesive layer 200, and the supporting substrate 20.

The side surface 10a is a surface formed by eliminating the respective parts of the n-type clad layer 103, the active layer 105, the p-type clad layer 107 and the p-type contact layer 109 due to a wet etching or the like. On the other hand, the side surface 10b is a surface formed by mechanically cutting the respective parts of the reflecting part 130, the cohesive layer 200 and the supporting substrate 20 due to a dicing using a dicing device or the like. Consequently, the side surface 10a has a smoother surface than the side surface 10b.

In addition, as shown in FIG. 1A, the light emitting element 1 according to the embodiment is formed in almost a square shape in top view. As an example, the light emitting element 1 has a planar dimension of 500 μm in length and 500 μm in width. Also, the light emitting element 1 is formed to have a thickness of almost 200 μm. Further, the light emitting element 1 according to the embodiment can be formed, for example, to have a chip size that the planar dimension is almost 300 µm or to have a large chip size that the planar dimension is not less than 500 µm.

Detail of Surface Electrode 110 and Contact Part 120

Figure 1C:
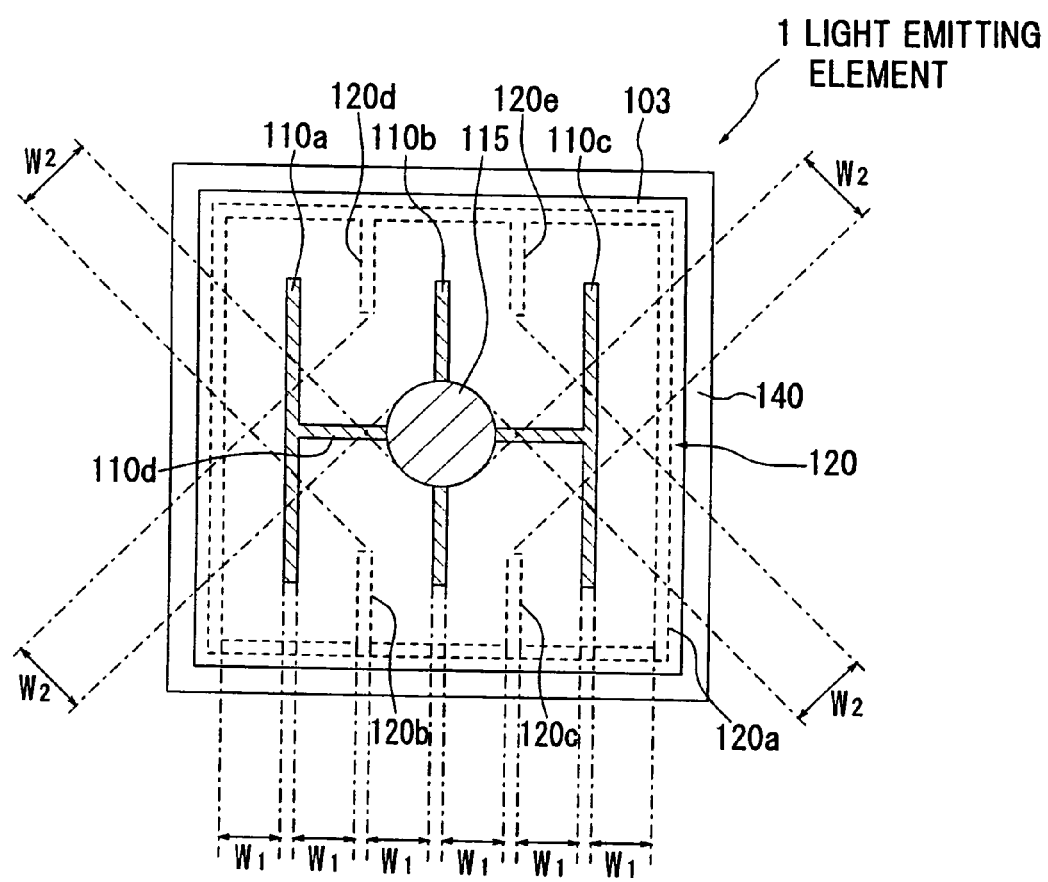
FIG. 1C is a detail top view schematically showing the light emitting element in the first embodiment according to the invention.
Figure 1D:
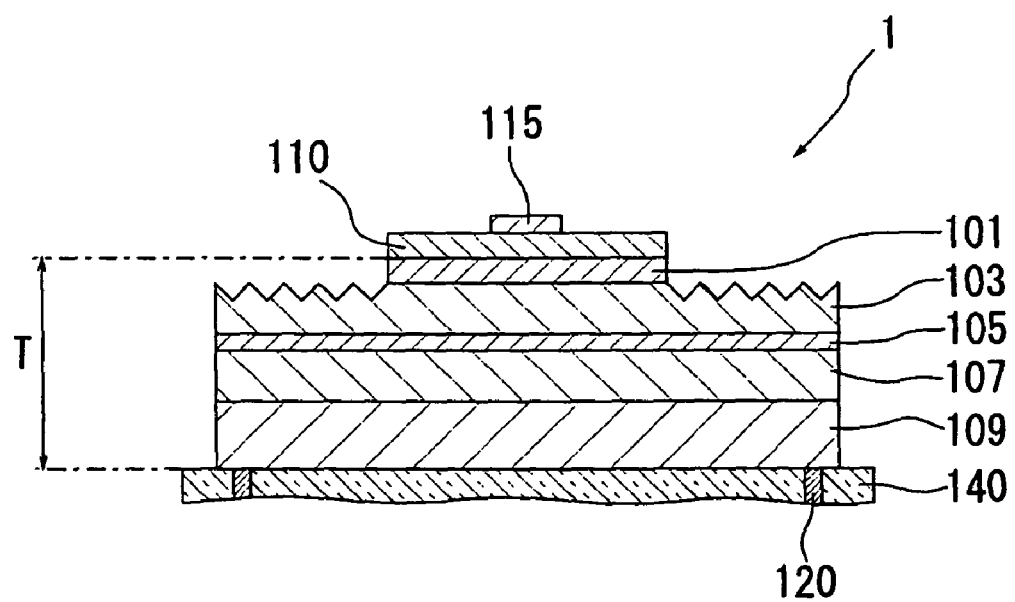
FIG. 1D is a partial longitudinal cross-sectional view schematically showing the light emitting element in the first embodiment according to the invention.

FIG. 1C is a detail top view schematically showing the light emitting element in the first embodiment according to the invention, and FIG. 1D is a partial longitudinal cross-sectional view schematically showing the light emitting element in the first embodiment according to the invention.

Hereinafter, detail of the surface electrode 110 and the contact part 120 will be explained with reference to FIG. 1C. The surface electrode 110 includes a circular electrode as a center electrode and a plurality of linear thin wire electrodes disposed on the n-type clad layer 103. For example, the surface electrode 110 includes a thin wire electrode 110a disposed so as to be adjacent to one side of the light emitting element 1 formed in almost a rectangular shape in top view and to be parallel to the one side, a thin wire electrode 110c disposed so as to be adjacent to an opposite side of the one side and to be parallel to the opposite side, and a thin wire electrode 110b located between the thin wire electrode 110a and the thin wire electrode 110c so as to have a distance equal from both of the thin wire electrode 110a and the thin wire electrode 110c, and disposed so as to be parallel to the thin wire electrode 110a and the thin wire electrode 110c. Further, the surface electrode 110 is formed, as an example, in a circular shape in top view, but not limited to this, it can be formed in a polygonal shape, for example, hexagonal shape or the like.

In addition, the surface electrode 110 further includes a thin wire electrode 110d extending in a direction almost perpendicular to a longitudinal direction of the respective thin wire electrodes 110a, 110b, 110c and disposed so as to contact the thin wire electrodes 110a, 110b, 110c at almost the middle of the thin wire electrodes 110a, 110b, 110c. Also, the surface electrode 110 has the circular electrode in a region including an intersection point of the thin wire electrode 110b and the thin wire electrode 110d. Namely, the thin wire electrodes 110b and the thin wire electrode 110d of the plural thin wire electrodes are respectively disposed so as to extend from a periphery of the circular electrode in a direction away from the periphery of the circular electrode (in other words, from the periphery of the circular electrode toward external edges of the light emitting element 1 in top view). Further, in FIG. 1C, the circular electrode is not shown since it is located directly below a pad electrode 115. Also, in top view, the pad electrode 115 is disposed at such a location that a center of the light emitting element 1 approximately corresponds to a center of the pad electrode 115.

Next, in top view, the contact part 120 includes parts protruding a plurality of thin wire parts into an opening located at a part of the transparent layer 140 extruding a region located directly below the surface electrode 110 toward the pad electrode 115, and it is disposed so as to have an external shape of almost rectangular shape. For example, in top view, the contact part 120 includes a periphery part 120a having a shape corresponding to the periphery of the light emitting element 1, a thin wire part 120b extending from one side of the periphery part 120a to a center so as to have a predetermined length and simultaneously disposed so that one end contacts the periphery part 120a, a thin wire part 120c extending from the one side of the periphery part 120a in a direction parallel to the thin wire part 120b and simultaneously disposed so as to keep a predetermined distance from the thin wire part 120b, and thin wire parts 120d, 120e extending from an opposite side of the one side of the periphery part 120a to a center so as to have a predetermined length and simultaneously disposed so as to face to the respective thin wire parts 120b, 120c. Further, the thin wire parts 120b to 120e have almost the same length together. In addition, the periphery part 120a of the contact part 120 is formed so as to have regions along a longitudinal direction of the thin wire electrode 110a or the like and regions extending perpendicular to the regions along the longitudinal direction (for example, if the contact part 120 has a portion of a rectangular shape in top view, the region along the longitudinal direction is one side of the rectangular shape and the region extending perpendicular to the region along the longitudinal direction is a side perpendicular to the one side).

Also, the contact part 120 according to the first embodiment includes a plurality of first regions disposed so as to be parallel to the thin wire electrode, and having the shortest distance between the thin wire electrode, and a second region allowing the plural first regions to be electrically connected together. For example, as shown in FIG. 1C, a part of the periphery part 120a and parts of the thin wire parts 120b to 120e correspond to the plural first regions disposed along the longitudinal direction of the thin wire electrodes 110a to 110c so as to be parallel to the thin wire electrodes 110a to 110c. Here, referring to FIG. 1C, the thin wire electrode 110d used in the first embodiment is disposed so as to be parallel to the contact part 120. Also, the thin wire electrode 110d is formed so as to have a distance between the contact part 120, the distance being longer than W1. Consequently, in the first embodiment, the first region to the thin wire electrode 110d does not exist.

Further, if the surface electrode 110 and the contact part 120 have curved regions, parallel carved lines formed by that carved lines are disposed so as to keep equal distance from each other are also included in the definition of the regions disposed so as to be parallel.

Also, in top view, the surface electrode 110 and the contact part 120 are arranged not to overlap each other. For example, the thin wire parts 120b, 120d are located between the thin wire electrodes 110a, 110b, and the thin wire parts 120b, 120d are respectively formed so as to have a length preventing the contact with the thin wire electrode 110d. Similarly, the thin wire parts 120c, 120e are located between the thin wire electrodes 110b, 110c, and the thin wire parts 120c, 120e are respectively formed so as to have a length preventing the contact with the thin wire electrode 110d.

In addition, the surface electrode 110 is formed to have an arrangement that the shortest current pathway between the circular electrode and the contact part 120 is substantially longer than the shortest current pathway between the thin wire electrodes 110a to 110d and the regions along the longitudinal direction of the contact part 120. For example, the surface electrode 110 is formed to have an arrangement that a current pathway from an external edge of the circular electrode (namely, the surface electrode 110 located directly below the pad electrode 115) to the contact part 120 closest to the external edge of the circular electrode (for example, an end portion of the thin wire part 120e) is longer than a current pathway from a side of a longitudinal direction of the thin wire electrode 110a to a side along a longitudinal direction of the contact part 120 closest to the side of the thin wire electrode 110a. Further, the surface electrode 110 is formed to include at least a region having an arrangement that the shortest current pathway between an end portion of the thin wire electrode (for example, the thin wire electrode 110a) and a region extending perpendicular to the region along the longitudinal direction of the contact part 120 is longer than the shortest current pathway between the thin wire electrode 110a and the region along the longitudinal direction. For example, the surface electrode 110 is formed to have an arrangement that the shortest current pathway from the end portion of the thin wire electrode 110a to the region of the contact part 120 extending perpendicularly is longer than the shortest current pathway from the side of the longitudinal direction of the thin wire electrode 110a to the region along the longitudinal direction.

Here, in top view of the light emitting element 1, the shortest distance from an external edge of the thin wire electrode of the surface electrode 110 to an external edge of the contact part 120 is defined as "$W_1$", and simultaneously the shortest distance from a periphery of the pad electrode 115 (namely, a periphery of the circular electrode of the surface electrode 110) to the contact part 120 is defined as "$W_2$". For example, the shortest distance from an external edge of the thin wire electrode 110a to the periphery part 120a and the shortest distance from the external edge of the thin wire electrode 110a to the thin wire part 120b correspond to $W_1$. Also, the shortest distance from an external edge of the pad electrode 115 to the thin wire part 120b and the shortest distance from an external edge of the pad electrode 115 to the thin wire part 120e correspond to $W_2$.

Here, it is preferable that the shortest distance $W_2$ from the periphery of the pad electrode 115 to the contact part 120 is formed so as to be longer than the shortest distance $W_1$ from the external edge of the thin wire electrode of the surface electrode 110 to the external edge of the contact part 120. The reason is as follows. Namely, with regard to light emission at a location direct below or adjacent to a part of the circular electrode (namely, the pad electrode 115) of the surface electrode 110, a light is absorbed by the part of the circular electrode and the pad electrode 115, so that light extraction efficiency is reduced. Namely, even if an amount of light emission at the location adjacent to the pad electrode 115 is increased, it is difficult to increase a light taking-out amount of the light emitting element 1. On the other hand, the thin wire electrode 110a and the like have a width thinner than the pad electrode 115, so that an adverse effect of blocking a light emitted from the active layer 105 or absorbing the light can be reduced. Consequently, it is preferable that a relationship that $W_1$ is smaller than $W_2$ is satisfied.

Additionally, referring to FIG. 1D, in the embodiment, a film thickness of the semiconductor laminated structure 10, namely, a thickness from the surface of the n-type contact layer 101 to the bottom surface of the p-type contact layer 109 is defined as "T".

Here, the light emitting element 1 according to the embodiment has an arrangement relationship between the surface electrode 110 and the contact part 120 that a square root (S1) of sum of square of the film thickness T of the semiconductor laminated structure 10 and square of the shortest distance $W_2$ between the pad electrode 115 and the contact part 120 in top view is larger than a square root (S2) of sum of square of film thickness T of the semiconductor laminated structure 10 and square of the shortest distance ($W_1$) between the fine wire electrode and the contact part 120 in top view.

$$S1=\sqrt{T^2+W_2^2}>S2=\sqrt{T^2+W_1^2}$$

By forming the surface electrode 110 and the contact part 120 satisfying the arrangement relationship, namely, the above-mentioned formula, an arrangement that the shortest current pathway between the pad electrode 115 (namely, the circular electrode of the surface electrode 110) and the contact part 120 is longer than the shortest current pathway between the thin wire electrode of the surface electrode 110 and the contact part 120 can be obtained. Consequently, electrical current flows more easily in the shortest current pathway between the thin wire electrode of the surface electrode 110 and the contact part 120 in comparison with the shortest current pathway between the pad electrode 115 and the contact part 120.

Further, the circular electrode of the surface electrode 110 is formed so as to have a diameter of not less than 75 µm according to a diameter of ball part of wire formed of a metal material such as gold (Au) to be connected to the pad electrode 115 disposed on the circular electrode. As an example, the circular electrode of the surface electrode 110 is formed so as to have a circular shape of 100 µm in diameter. Also, the thin wire electrode 110a to 110d of the surface electrode 110 is formed so as to have a linear shape of 10 µm in width. Further, the contact part 120 is formed on a part of a surface of the p-type contact layer 109 excluding a region directly below the surface electrode 110. Particularly, the contact part 120 is formed in an opening disposed so as to pass through the transparent layer 140, so that it allows the semiconductor laminated structure 10 and the reflecting layer 132 to be electrically connected. As an example, the contact part 120 is formed of a metal material containing a metal such as gold (Au), zinc (Zn).

Semiconductor Laminated Structure 10

The semiconductor laminated structure 10 according to the embodiment is formed so as to include a AlGaInP compound semiconductor of a III-V compound semiconductor. Particularly, the semiconductor laminated structure 10 has a structure that the active layer 105 formed of bulk of undoped AlGaInP compound semiconductor not doped with dopants of impurities is sandwiched between the n-type clad layer 103 formed so as to include a n-type AlGaInP and the p-type clad layer 107 formed so as to include a p-type AlGaInP.

The active layer 105 emits a light of a predetermined wavelength when electrical current is supplied from outside. For example, the active layer 105 is formed of a compound semiconductor material for emitting a red light of a wavelength around 630 nm. The active layer 105 is formed of, as an example, an undoped $(Al_{0.1}Ga_{0.9})_{0.5}In_{0.5}P$ layer. Also, the n-type clad layer 103 contains a n-type dopant such as Si, Se at a predetermined concentration. The n-type clad layer 103 is formed of, as an example, a n-type $(Al_{0.7}Ga_{0.3})_{0.5}In_{0.5}P$ doped with Si layer. Further, the p-type clad layer 107 contains a p-type dopant such as Zn, Mg at a predetermined concentration. The p-type clad layer 107 is formed of, as an example, a p-type $(Al_{0.7}Ga_{0.3})_{0.5}In_{0.5}P$ layer doped with Mg.

Furthermore, the p-type contact layer 109 that the semiconductor laminated structure 10 has, as an example, is formed of a p-type GaP layer doped with Si at a predetermined concentration. Also, the n-type contact layer 101 is formed of a GaAs layer doped with Si at a predetermined concentration. Here, the n-type contact layer 101 is disposed in a region where the surface electrode 110 is disposed, on an upper surface of the n-type clad layer 103.

Transparent Layer 140

The transparent layer 140 is disposed on a region of a surface of the p-type contact layer 109 where the contact part 120 is not disposed. The transparent layer 140 is formed of a material having a transparency to a wavelength of a light emitted from the active layer 105, as an example, it is formed of a transparent dielectric layer such as $SiO_2$, $TiO_2$, $SiN_x$. Also, the transparent layer 140 is formed so as to have a thickness of not less than $(2\times\lambda)/(4\times n)$, if the wavelength of the light emitted from the active layer 105 is defined as $\lambda$ and the refractive index of the material constituting the transparent layer 140 is defined as n. Further, the transparent layer 140 can be also formed of a transparent conductive layer containing a metal oxide material that has an electrical conductivity lower than the contact part 120 such as indium tin oxide (ITO).

In addition, the transparent layer 140 can be also formed of a laminated structure formed of a plurality of materials having a different refraction index respectively. Namely, the transparent layer 140 can be formed so as to have a distributed bragg reflector (DBR) structure. For example, the transparent layer 140 can be formed so as to have a DBR structure that a plurality of pair layers having a $SiO_2$ layer of a predetermined thickness and a $TiO_2$ layer of a predetermined thickness as a pair respectively are laminated.

Reflecting Part 130

The reflecting layer 132 of the reflecting part 130 is formed of an electrical conductive material having a high reflectance to the light emitted from the active layer 105. As one example, the reflecting layer 132 is formed of an electrical conductive material having the reflectance of not less than 80% to the light. The reflecting layer 132 reflects the light having reached the reflecting layer 132 of the light emitted from the active layer 105 toward a side of the active layer 105. The reflecting layer 132 is formed of, for example, a metal material such as Al, Au, Ag or an alloy containing at least one selected from the metal materials. As an example, the reflecting layer 132 is formed of Al having a predetermined thickness. Also, the barrier layer 134 of the reflecting part 130 is formed of a metal material such as Ti, Pt, and as an example, it is formed of Ti having a predetermined thickness. The barrier layer 134 prevents a material constituting the joining layer 136 from being transmitted to the reflecting layer 132. In addition, the joining layer 136 is formed of a material capable of electrically and mechanically connecting to the joining layer 202 of the cohesive layer 200, and as an example, it is formed of Au having a predetermined thickness.

Supporting Substrate 20

The supporting substrate 20 is formed of a conductive material. The supporting substrate 20 can be formed of a semiconductor substrate such as a p-type or n-type conductive substrate of Si, Ge or GaP, or a metal substrate of a metal material such as Cu. For example, in the embodiment, the conductive Si substrate can be used for the supporting substrate 20.

In addition, the joining layer 202 of the cohesive layer 200 can be formed of Au having a predetermined thickness, similarly to the joining layer 136 of the reflecting part 130. Also, the barrier layer 204 is formed of a metal material such as Ti, Pt, and as an example, it is formed of Pt having a predetermined thickness. The barrier layer 204 prevent a material constituting the joining layer 202 from being transmitted to the contact electrode 206. Further, the contact electrode 206 is formed of a material capable of electrically and mechanically connecting to the supporting substrate 20, and it is formed of a metal material containing Au, Ti, Al or the like. As an example, the contact electrode 206 is formed of Ti having a predetermined thickness.

The rear surface electrode 210 is formed of a material capable of electrically connecting to the supporting substrate 20, and for example, it is formed of a metal material such as Ti, Au. In the embodiment, the rear surface electrode 210 includes Ti and Au. Particularly, Ti having a predetermined thickness is disposed on the supporting substrate 20 so as to be electrically connected to the supporting substrate 20, and Au having a predetermined thickness is disposed on Ti. Further, the light emitting element 1 is mounted on a predetermined location of a stem formed of a metal material such as Al, Cu by using a conductive joining material such as Ag paste or a eutectic material such as AuSn, while a side of the rear surface electrode 210 is directed downward.

Modification

The light emitting element 1 according to the embodiment emits a light containing a red color having a wavelength of 630 nm, but the wavelength of the light emitted from the light emitting element 1 is not limited to the above-mentioned wavelength. The light emitting element 1 can be formed so as to emit a light having a predetermined wavelength range by controlling a structure of the active layer 105 of the semiconductor laminated structure 10. The light emitted from the active layer 105 includes a light having a wavelength range such as an orange light, yellow light, green light or the like. Also, the semiconductor laminated structure 10 included in the light emitting element 1 can be also formed of a InAlGaN compound semiconductor including the active layer 105 which emits a light having ultraviolet region, purple region or blue region.

Further, the semiconductor laminated structure 10 included in the light emitting element 1 can have an opposite conductive type of the compound semiconductor constituting the semiconductor laminated structure 10 to the conductive type in the first embodiment. For example, the conductive types of the n-type contact layer 101 and the n-type clad layer 103 can be changed to a p-type, and the conductive types of the p-type clad layer 107 and the p-type contact layer 109 can be changed to a n-type. In addition, the concavo-convex part 103a can be also formed on a surface of the n-type clad layer 103 by forming a concavo-convex portion having no regularity on the surface of the n-type clad layer 103.

Also, the contact part 120 is formed in a single shape having no cut portion, but in the modification, the contact part 120 can be also formed so as to have a plurality of sections by forming cut portions in a part of the contact part 120. For example, the contact part 120 can be also formed to have a shape of plural dots.

Further, the planar dimension of the light emitting element 1 is not limited to the planar dimension described in the embodiment. For example, the planar dimension of the light emitting element 1 can be designed to be 300 μm in length and 300 μm in width or to be more than 1 mm in length and width. And, the light emitting element 1 can be also formed by appropriately changing the dimension in length and width according to the use purpose. As an example, the planar dimension of the light emitting element 1 can be designed to have the length shorter than the width. In the case, the light emitting element 1 has a shape of almost rectangle in top view.

Furthermore, the active layer 105 can be formed so as to have a quantum well structure. As the quantum well structure, any of a single quantum well structure, a multiple quantum well structure and a strained quantum well structure can be used.

Method of Fabricating Light Emitting Element 1

Figure 2A:
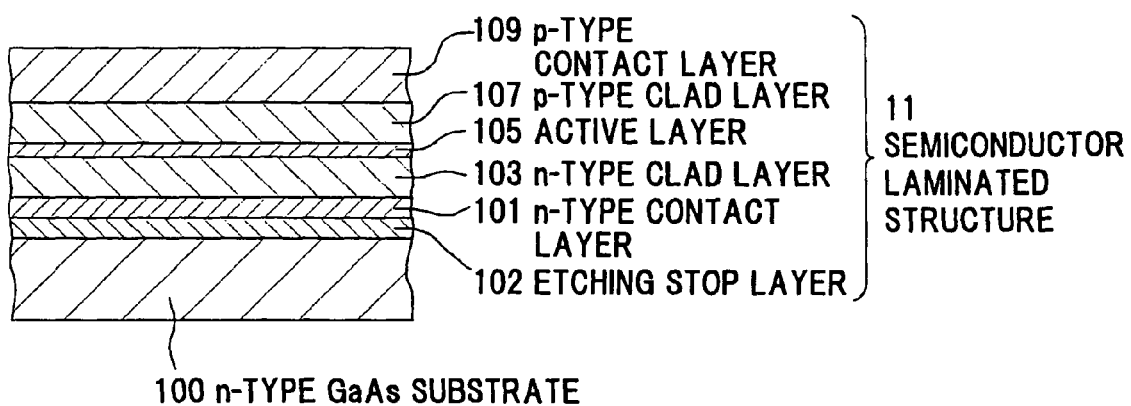
FIGS. 2A to 2P are cross-sectional views schematically showing the respective processes in a series of fabricating processes of the light emitting element in the first embodiment according to the invention.
Figure 2B:
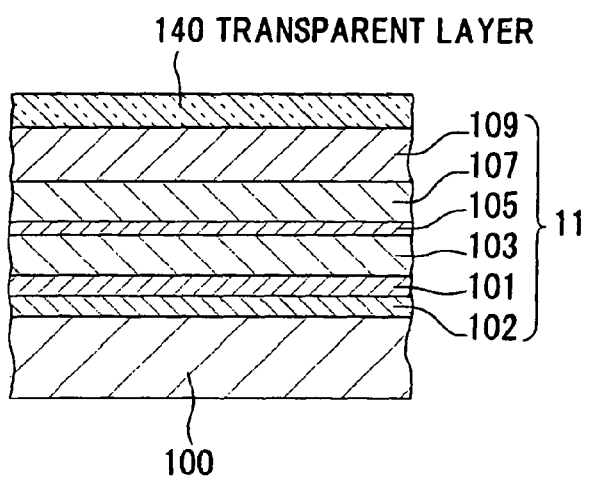
Figure 2C:
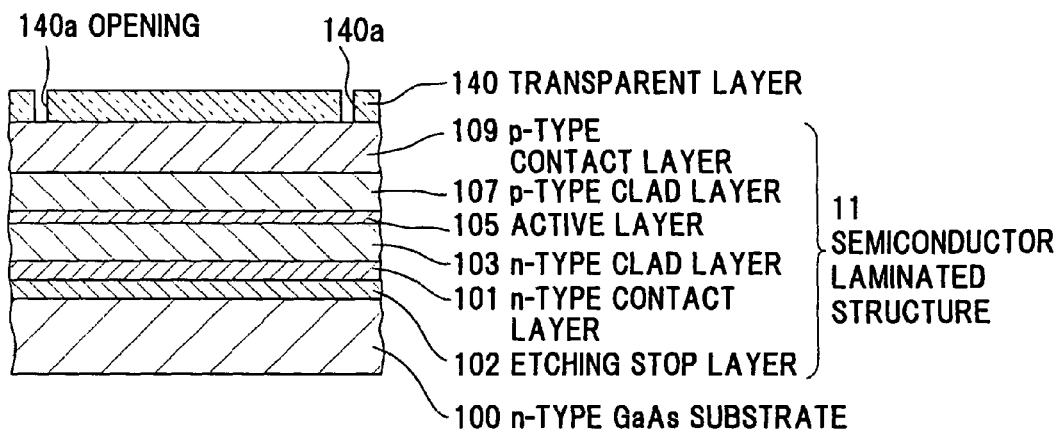
Figure 2D:
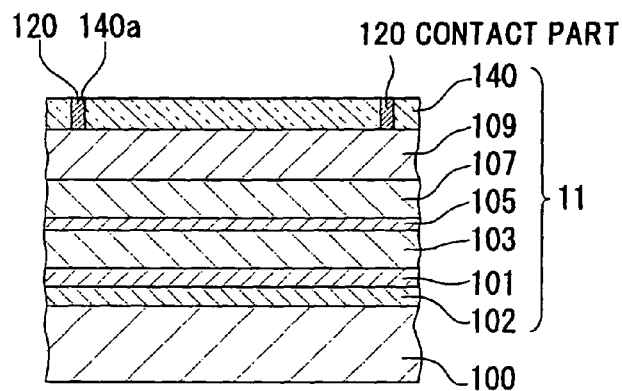
Figure 2E:
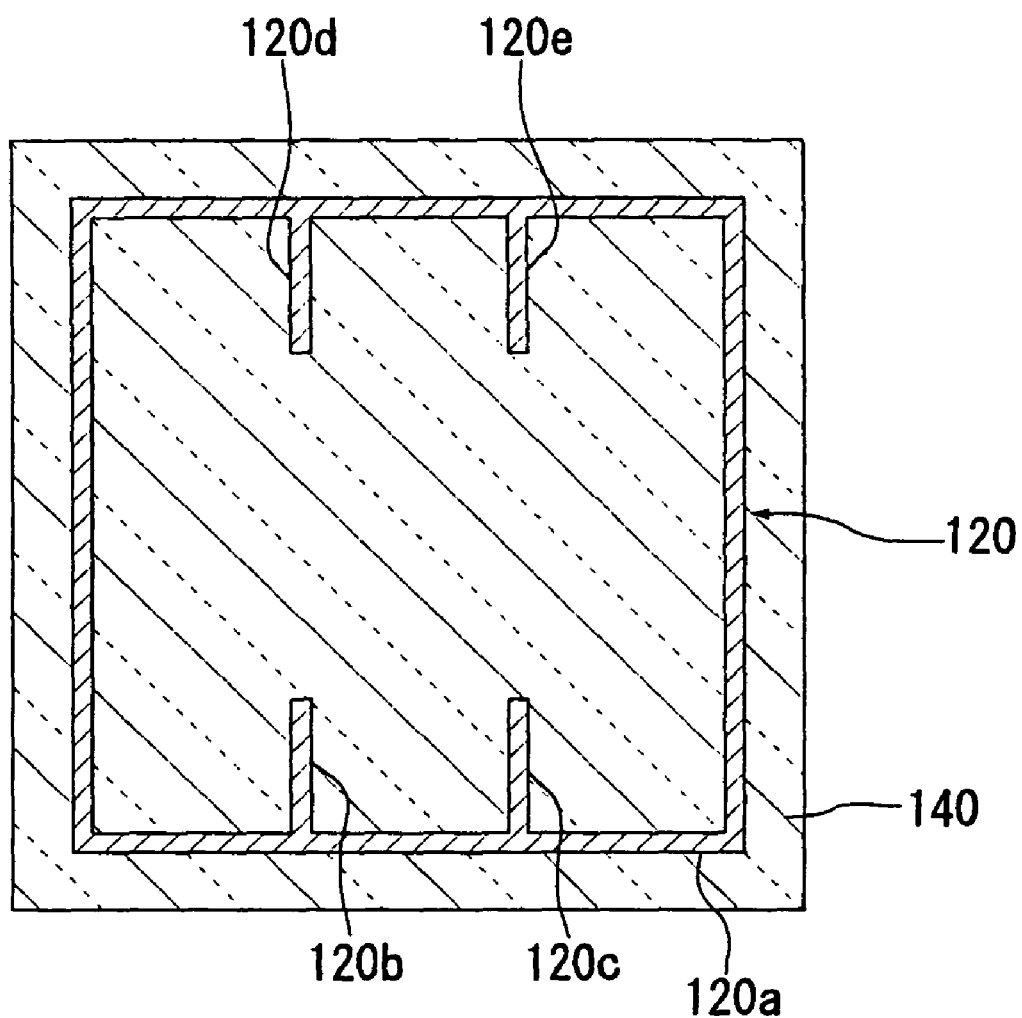
Figure 2F:
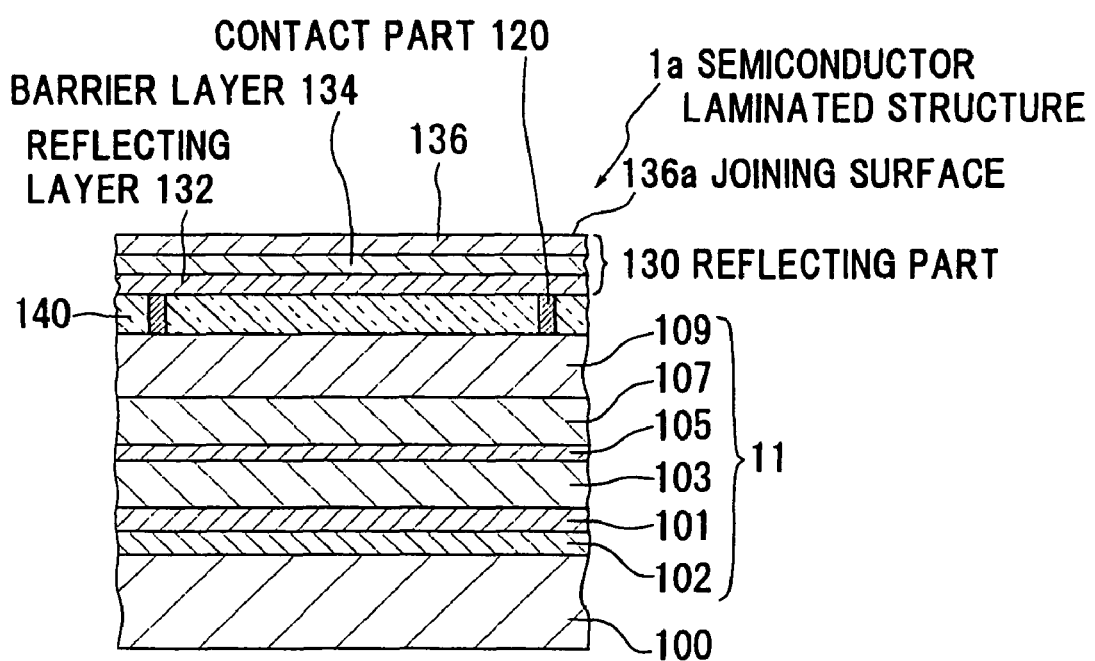
Figure 2L:
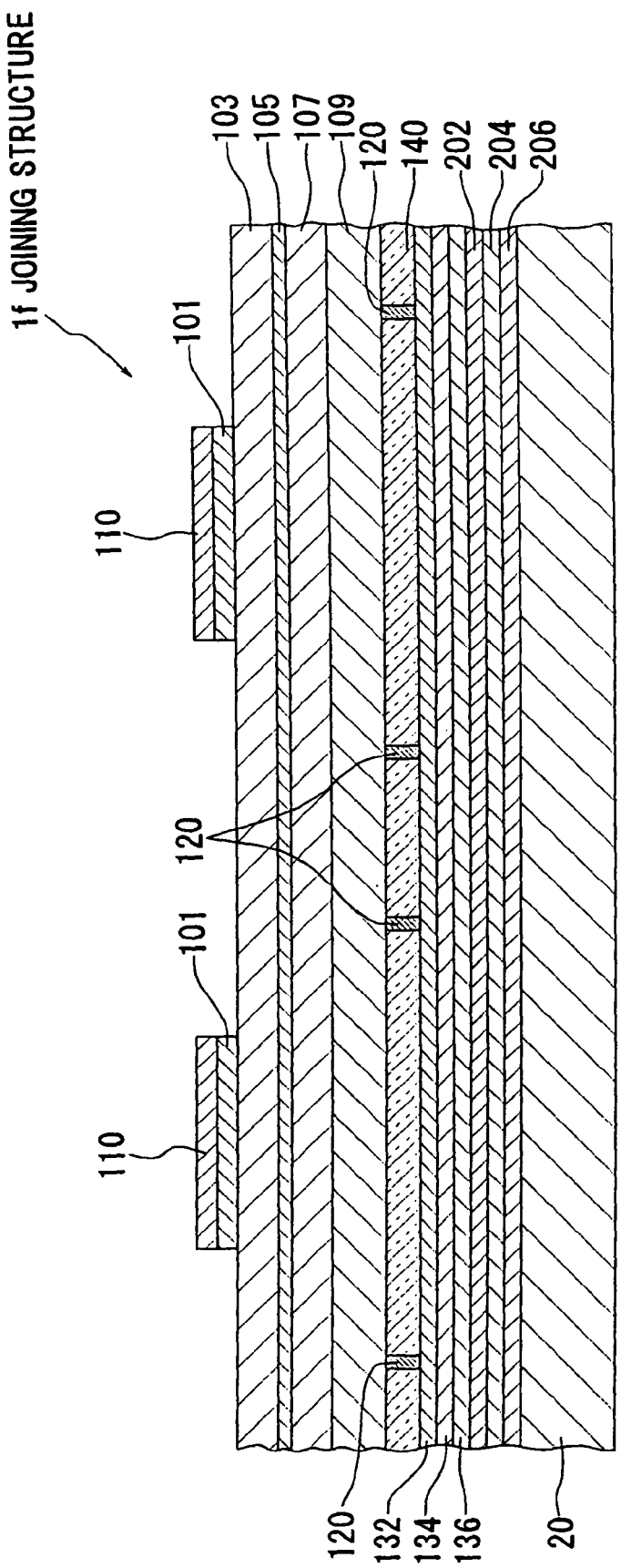
Figure 2M:
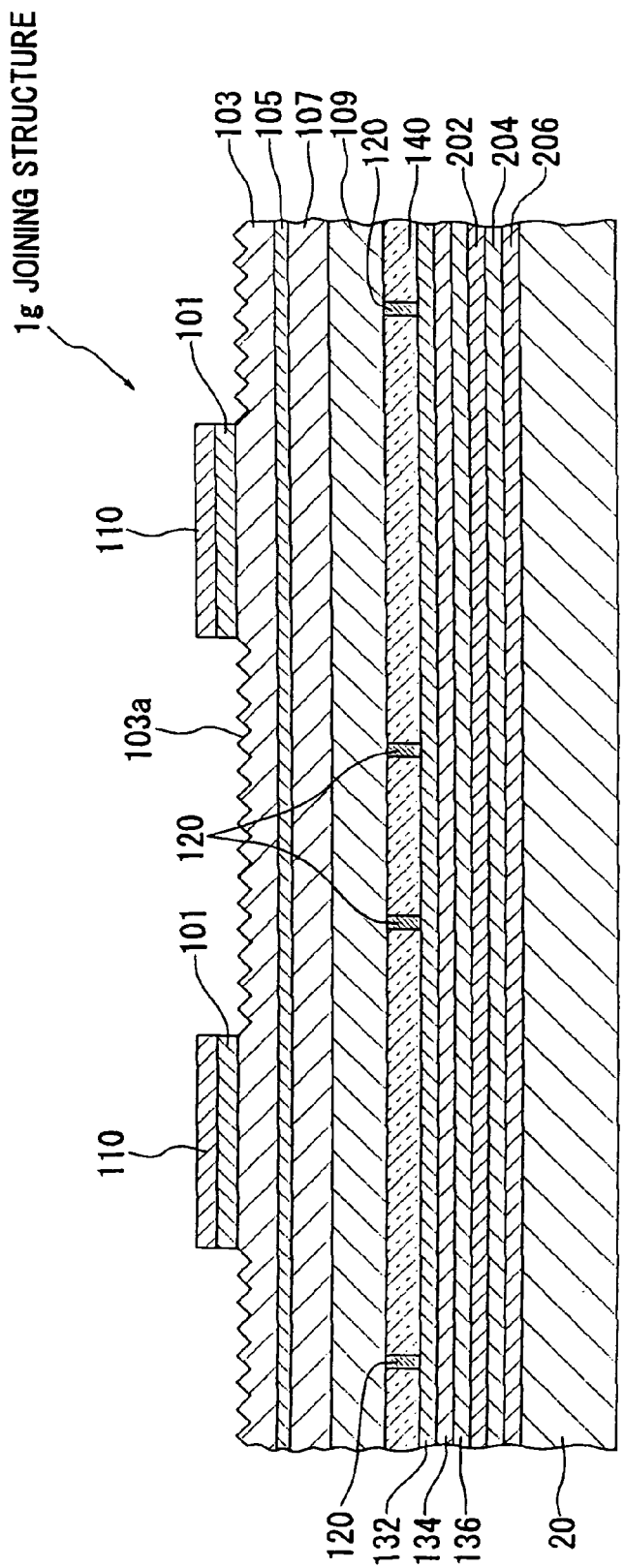
Figure 20:
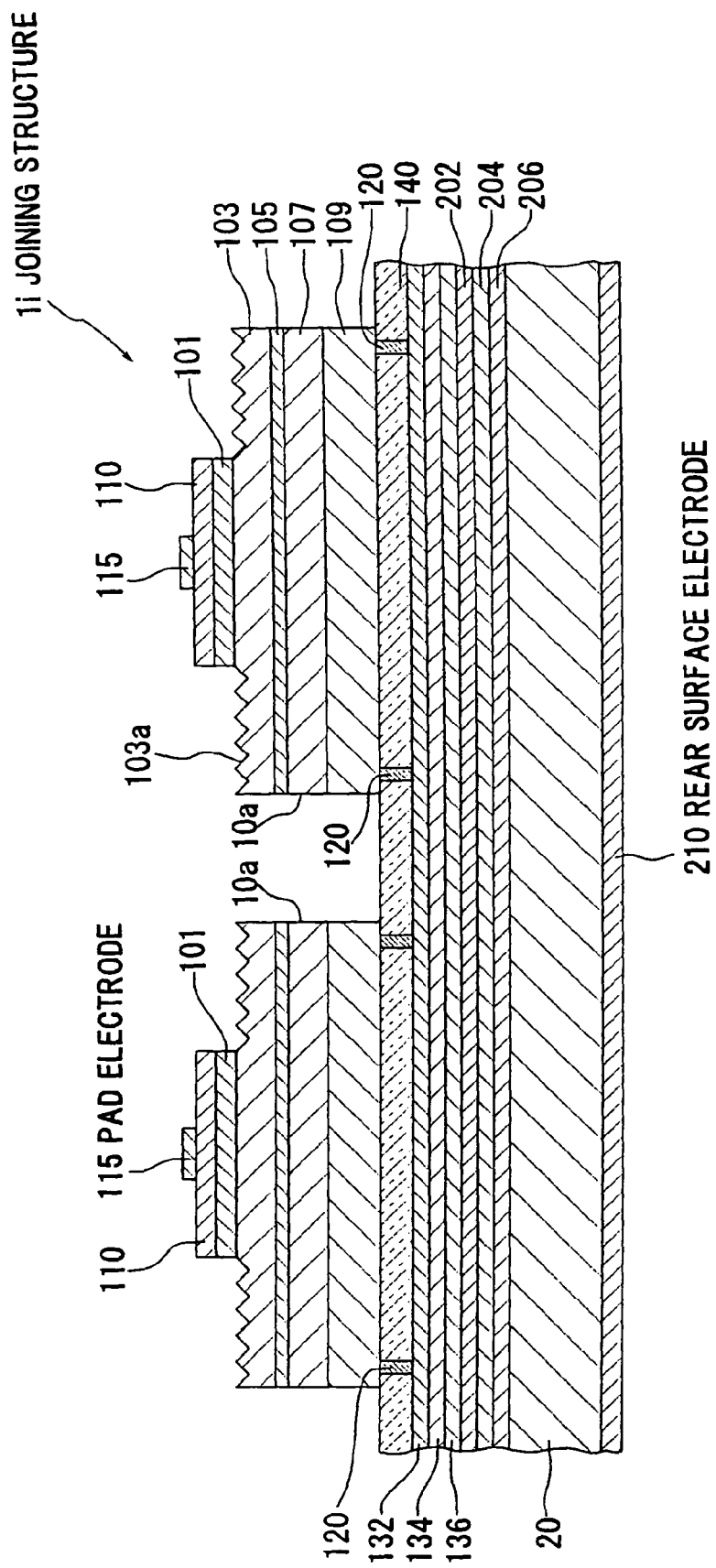
Figure 2P:
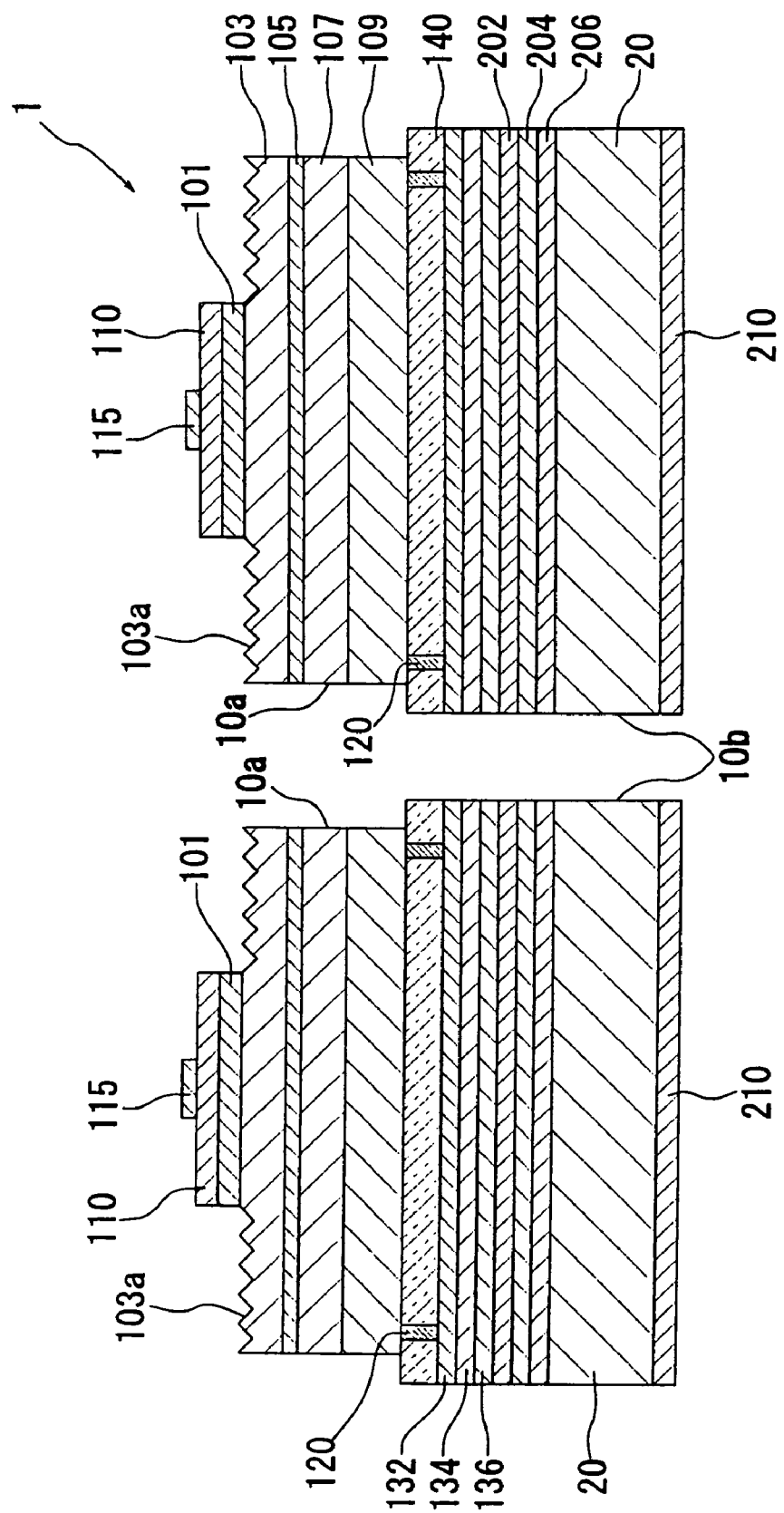

FIGS. 2A to 2P are cross-sectional views schematically showing the respective processes in a series of fabricating processes of the light emitting element in the first embodiment according to the invention.

First, as shown in FIG. 2A, a AlGaInP semiconductor laminated structure 11 including a plurality of compound semiconductors is formed on a n-type GaAs substrate 100, for example, by a metal organic vapor phase epitaxy (MOVPE) method. Particularly, on the n-type GaAs substrate 100, an etching stop layer 102 including undoped $(Al_{0.7}Ga_{0.3})_{0.5}In_{0.5}P$, a n-type contact layer 101 including a n-type GaAs doped with Si, a n-type clad layer 103 including a n-type $(Al_{0.7}Ga_{0.3})_{0.5}In_{0.5}P$ doped with Si, an active layer 105 including undoped $(Al_{0.1}Ga_{0.9})_{0.5}In_{0.5}P$, a p-type clad layer 107 including a p-type $(Al_{0.7}Ga_{0.3})_{0.5}In_{0.5}P$ doped with Mg, and a p-type contact layer 109 including a p-type GaP doped with Mg are formed in this order by using the MOVPE method. Due to this, an epitaxial wafer having a structure that the semiconductor laminated structure 11 is formed on the n-type GaAs substrate 100 is formed.

Here, the formation of the semiconductor laminated structure 11 by using the MOVPE method is carried out by setting a growth temperature at 650 degrees C., a growth pressure at 6666.1 Pa (50 Torr), the respective growth speeds of a plurality of the compound semiconductors included in the semiconductor laminated structure 11 at 0.3 nm/sec to 1.0 nm/sec, and a V/III ratio to almost 200. Further, the V/III ratio means a ratio of molar ratio of V group materials such as arsine ($AsH_3$), phosphine ($PH_3$) to molar ratio of III group materials such as trimethylgallium (TMGa), trimethylaluminum (TMAl).

Also, a material used in the MOVPE method includes an organic metal compound such as trimethylgallium (TMGa), triethylgallium (TEGa), trimethylaluminum (TMAl), trimethylindium (TMIn) and a hydride gas such as arsine ($AsH_3$), phosphine ($PH_3$). Further, a material of the n-type dopant includes disilane ($Si_2H_6$). And, a material of the p-type dopant includes biscyclopentadienylmagnesium ($Cp_2Mg$).

Furthermore, as the material of the n-type dopant, hydrogen selenide ($H_2Se$), monosilane ($SiH_4$), diethyltellurium (DETe) or dimethyltellurium (DMTe) can be also used. And, as the material of the p-type dopant, dimethylzinc (DMZn) or diethylzinc (DEZn) can be used.

Further, the semiconductor laminated structure 11 on the n-type GaAs substrate 100 can be also formed by using a molecular beam epitaxy (MBE) method or a halide vapor phase epitaxy (HVPE) method.

Next, as shown in FIG. 2B, after the epitaxial wafer formed in a process shown in FIG. 2A is carried out of the MOVPE device, the transparent layer 140 is formed on a surface of the p-type contact layer 109. Particularly, a $SiO_2$ film as the transparent layer 140 is formed on the surface of the p-type contact layer 109 by using a plasma chemical vapor deposition (CVD) device. Further, if the transparent layer 140 is formed of a plurality of layers, it can be also formed by a vacuum vapor deposition method.

Next, as shown in FIG. 2C, an opening 140a is formed in the transparent layer 140 by using a photolithography method and an etching method. For example, a photoresist pattern having a groove is formed on a region of the transparent layer 140 where the opening 140a is to be formed. The opening 140a is formed so as to pass through from the surface of the transparent layer 140 to an interface between the p-type contact layer 109 and the transparent layer 140. Particularly, the opening 140a is formed in the transparent layer 140 by eliminating a region of the transparent layer 140 where the photoresist pattern is not formed by using an etchant as a hydrofluoric acid etching liquid. Further, the opening 140a is formed in a region where the contact part 120 is to be formed as explained in FIG. 1A.

Subsequently, as shown in FIG. 2D, a AuZn alloy which is a material constituting the contact part 120 is formed in the opening 140a by using the vacuum vapor deposition method. For example, the contact part 120 is formed by allowing the AuZn alloy to be vacuum-deposited in the opening 140a by using the photoresist pattern used when the opening 140a is formed as a mask. Due to this, as shown in FIG. 2E, the contact part 120 of the AuZn alloy is formed in the transparent layer 140. Further, an explanation about a shape of the contact part 120 will be omitted since it has been explained in detail at a paragraph of "Detail of surface electrode 110 and contact part 120".

Next, as shown in FIG. 2F, a Al layer as the reflecting layer 132, a Ti layer as the barrier layer 134 and a Au layer as the joining layer 136 are formed by using the vacuum vapor deposition method or a sputtering method. Due to this, a semiconductor laminated structure 1a is formed. Further, as the reflecting layer 132, a material is selected from materials having a high reflectance to the light emitted from the active layer 105 according to the light.

Also, as shown in FIG. 2G, Ti as the contact electrode 206, Pt as the barrier layer 204 and Au as the joining layer 202 are formed on a conductive Si substrate as the supporting substrate 20 in this order by using the vacuum vapor deposition method. Due to this, a supporting structure 20a is formed. Subsequently, a joining surface 136a of the joining layer 136 of the semiconductor laminated structure 1a and a joining surface 202a of the joining layer 202 of the supporting structure 20a are overlapped so as to face each other, and the state is maintained by using a jig formed of carbon or the like.

Subsequently, the jig maintaining the state that the semiconductor laminated structure 1a and the supporting structure 20a are overlapped is introduce into a wafer bonding device. And, a predetermined pressure is kept in the wafer bonding device. As an example, the pressure is set at 1.333 Pa (0.01 Torr). And, the pressure is applied to the semiconductor laminated structure 1a and the supporting structure 20a which are mutually overlapped via the jig. As an example, a pressure of 30 kgf/cm$^2$ is applied. Next, the jig is heated until a predetermined temperature, at a predetermined heating-up speed.

Particularly, the jig is heated up to 350 degrees C. And, after the temperature of the jig has reached at almost 350 degrees C., the jig is maintained at the temperature for almost 30 minutes. After that, the jig is cooled slowly. The temperature of the jig is sufficiently lowered, for example, back to room temperature. After the temperature of the jig has been lowered, the pressure applied to the jig is released. And, the pressure in the wafer bonding device is back to atmosphere pressure and the jig is taken out from the device. Due to this, as shown in FIG. 2H, a joining structure 1b is formed that the semiconductor laminated structure 1a and the supporting structure 20a are mechanically and electrically joined between the joining layer 136 and the joining layer 202.

Further, in the embodiment, the semiconductor laminated structure 1a has the barrier layer 134. Consequently, even if the semiconductor laminated structure 1a and the supporting structure 20a are joined at the joining layer 136 and the joining layer 202, materials constituting the joining layer 136 and the joining layer 202 are prevented from diffusing into the reflecting layer 132, the reflecting layer 132 can be prevented from deterioration of reflecting characteristics.

Next, the joining structure 1b is joined to a jig of polishing device with a joining wax. Particularly, a side of supporting substrate 20 thereof is joined to the jig. And, the n-type GaAs substrate 100 of the joining structure 1b is polished so as to have a predetermined thickness. Subsequently, the joining structure 1b after polished is removed from the jig of the polishing device, and the wax adhered to the surface of the supporting substrate 20 is removed by washing. And, as shown in FIG. 2I, a joining structure 1c where an etching stop layer 102 is exposed is formed by selectively and perfectly removing the n-type GaAs substrate 100 from the joining structure 1b after polished by using an etchant for GaAs etching. The etchant for GaAs etching includes, for example, a mixed liquid of ammonia water and hydrogen peroxide water. Further, all the n-type GaAs substrate 100 can be also removed by etching, instead of polishing the n-type GaAs substrate 100.

And, as shown in FIG. 2J, the etching stop layer 102 is removed from the joining structure 1c by the etching that uses a predetermined etchant. Due to this, the joining structure 1d where the etching stop layer 102 is removed is formed. In case that the etching stop layer 102 is formed of the AlGaInP compound semiconductor, as the predetermined etchant, an etchant containing hydrochloric acid can be used. Due to this, a surface of the n-type contact layer 101 is exposed exteriorly.

Subsequently, the surface electrode 110 is formed in a predetermined location of the surface of n-type contact layer 101 by using the photolithography method and the vacuum vapor deposition method. The surface electrode 110 is formed of a circular electrode having a diameter of 100 μm and a plurality of thin wire electrodes having a width of 10 μm. The surface electrode 110 is formed, for example, by depositing AuGe, Ti and Au on the n-type contact layer 101 in this order. In this case, the surface electrode 110 is formed so as not to be located directly above the contact part 120. Further, an explanation about detail of the shape of surface electrode 110 will be omitted since it has been explained in detail at a paragraph of "Detail of surface electrode 110 and contact part 120". Due to this, as shown in FIG. 2K, a joining structure 1e having the surface electrode 110 is formed.

Next, as shown in FIG. 2L, a part of the n-type contact layer 101 excluding a part of the n-type contact layer 101 located directly below the surface electrode 110 is removed by the etching that uses a mixed liquid of sulfuric acid, hydrogen peroxide water and water, and uses the surface electrode 110 as a mask. Due to this, a joining structure 1f is formed. Further, due to using the mixed liquid, the n-type contact layer 101 formed of GaAs can be etched selectively to the n-type clad layer 103 formed of n-type $(Al_{0.7}Ga_{0.3})_{0.5}In_{0.5}P$. Consequently, in the joining structure 1f, the surface of n-type clad layer 103 is exposed exteriorly.

Next, as shown in FIG. 2M, the concavo-convex part 103a is formed on a part of the surface of the n-type clad layer 103. Particularly, a mask pattern that a pattern for concave portion or a pattern for convex portion is repeated at a predetermined intervals is formed on the surface of n-type clad layer 103 by using the photolithography method. For example, the mask pattern is formed that the pattern for concave portion or the pattern for convex portion is repeated at intervals within a range of not less than 1.0 μm to not more than 3.0 μm. Further, the pattern for concave portion or the pattern for convex portion is formed, for example, so as to have an arrangement of a matrix shape, a honeycomb shape or the like. And, the concavo-convex part 103a is formed on the surface of n-type clad layer 103 by a wet etching method that uses the formed mask pattern as a mask. Due to this, a joining structure 1g having the concavo-convex part 103a is formed.

Subsequently, a mask pattern for isolating the light emitting elements 1 from each other is formed on a surface of the joining structure 1g by using the photolithography method. Namely, the mask pattern for isolating the light emitting elements is formed on the surface of n-type clad layer 103 of the joining structure 1g. Each of the light emitting elements is isolated from each other by removing from a side of the surface of n-type clad layer 103 to the p-type contact layer 109 by the wet etching method that uses the mask pattern as a mask. Due to this, as shown in FIG. 2N, a joining structure 1h where the plural light emitting elements are isolated respectively is formed. Further, a side surface 10a is a surface exposed by the wet etching method, and it has smoother surface than a surface obtained by mechanically cutting the semiconductor laminated structure 10.

Next, the rear surface electrode 210 is formed on almost the whole surface of rear surface of the supporting substrate 20 by the vacuum vapor deposition method. The rear surface electrode 210 is formed by depositing Ti and Au on a bottom surface of the supporting substrate 20 in this order. After that, an alloy process is applied to the joining structure 1h having the rear surface electrode 210, the alloy process being a process for producing an alloy that forms the respective electrical joining between the contact part 120 and the p-type contact layer 109, between the surface electrode 110 and the n-type contact layer 101, between the contact electrode 206 and the supporting substrate 20, and between the rear surface electrode 210 and the supporting substrate 20. As an example, a heat treatment under conditions of at 400 degrees C., for 5 minutes, and under nitrogen atmosphere as an inert atmosphere is applied to the joining structure 1h. Subsequently, the pad electrode 115 is formed on a part of the surface of the surface electrode 110, particularly, on the circular electrode by using the photolithography method and the vacuum vapor deposition method. The pad electrode 115 is formed, for example, by depositing Ti and Au on the surface of the circular electrode of the surface electrode 110 in this order. Due to this, a joining structure 1i shown in FIG. 2O is formed.

And, the joining structures 1i are isolated to each element by using a dicing device having dicing blades. Due to this, as shown in FIG. 2P, a plurality of the light emitting elements 1 according to the embodiment are formed. In this case, the side surfaces 10b are formed in regions mechanically cut by the dicing blades. The side surface 10b has larger concavity and convexity than the surface of the side surface 10a since the side surface 10b is a region mechanically cut.

The light emitting element 1 fabricated via each of the processes shown in FIGS. 2A to 2P is, as an example, a light emitting diode (LED) having an approximately square shape, whose planar dimension (element size) is 500 μm-square. And, the light emitting element 1 is die-bonded to a TO-18 stem by using an electrical conductive joining material, and the surface electrode 110 and a predetermined region of the TO-18 stem are connected to each other by a wire of Au or the like. Due to this, characteristics of the light emitting element 1 can be evaluated by supplying electrical current from outside to the pad electrode 115 via the wire.

Particularly, a resin mold was applied to the light emitting element 1 fabricated by the above-mentioned processes, and an initial characterization of the light emitting element 1 after the resin mold was evaluated. In particular, the initial characterization of the light emitting element 1 including the following composition was evaluated. Further, the light emitting element 1 has a structure shown in FIGS. 1A to 1D.

First, the semiconductor laminated structure 10 was formed of the n-type contact layer 101 of a GaAs layer doped with Si, the n-type clad layer 103 of n-type $(Al_{0.7}Ga_{0.3})_{0.5}In_{0.5}P$ doped with Si, the undoped active layer 105 of $(Al_{0.1}Ga_{0.9})_{0.5}In_{0.5}P$, the p-type clad layer 107 of p-type $(Al_{0.7}Ga_{0.3})_{0.5}In_{0.5}P$ doped with Mg, and the p-type contact layer 109 of p-type GaP doped with Mg.

Also, an electrical conductive Si substrate as the supporting substrate 20, a Ti layer as the contact electrode 206, a Pt layer as the barrier layer 204 and an Au layer as the joining layer 202 were respectively used. And, an Au layer as the joining layer 136 of the reflecting part 130, a Ti layer as the barrier layer 134, and an Al layer as the reflecting layer 132 were respectively used. Further, SiO2 as the transparent layer 140 and AuZn as the contact part 120 were respectively used. A width of the contact part 120 was set to 10 μm. And, as the surface electrode 110, AuGe, Ti, and Au were used. A diameter of the circular electrode of the surface electrode 110 was set to 100 µm, and a width of the thin wire electrode was set to 10 µm. And, the pad electrode 115 was formed of Ti/Au. Namely, in the structure, the Ti layer and the n-type contact layer 101 were formed so as to contact each other. Further, the element size was set to 500 µm-square in top view.

Further, the S1 shown in the above-mentioned formula was set to 25 µm (S1=25 µm), and D was defined as S1-S2 (D=S1-S2) and light emitting elements where values of the D were changed were fabricated. Furthermore, the resin mold was carried out by sealing the light emitting element mounted on the TO-18 stem by using epoxy resin.

FIG. 3 is a graph schematically showing a light output due to difference of the value of D of the light emitting element.

A light output of the light emitting element was measured by applying electrical current of 20 mA to the light emitting element. As a result, as shown in FIG. 3, it has been confirmed that the light output is heightened in the light emitting element according to the first embodiment having a positional relationship between the surface electrode 110 and the contact part 120 where a relation that D is more than 0, namely, S1 is larger than S2 (S1>S2) is satisfied. It is considered that this is due to the fact that the shortest current pathway between the thin wire electrode of the surface electrode 110 and the contact part 120 is shorter than the shortest current pathway between the circular electrode of the surface electrode 110 and the contact part 120 where the light emitted from the active layer 105 is absorbed so that a light emission in the active layer 105 located directly below the circular electrode of the surface electrode 110 can be prevented.

Advantages of the First Embodiment

The light emitting element 1 according to the embodiment has a positional relationship of the surface electrode 110 to the contact part 120 that the shortest current pathway between the circular electrode of the surface electrode 110 and the contact part 120 in top view is longer than the shortest current pathway between the thin wire electrode of the surface electrode 110 and the contact part 120 in top view, so that electrical current supplied to the pad electrode 115 is preferentially transmitted from the thin wire electrode of the surface electrode 110 to the contact part 120. Due to this, according to the light emitting element 1 of the embodiment, a light emission directly under the pad electrode 115 of the light emitting element 1 in top view where light is most absorbed can be reduced, so that the light emitting element 1 having an enhanced light extraction efficiency and a high light output can be provided.

Second Embodiment

FIG. 4 is a top view schematically showing a light emitting element in a second embodiment according to the invention.

A light emitting element 2 according to the second embodiment includes almost the same composition as the light emitting element 1 of the first embodiment except for different points of arrangements of the thin wire electrode of the surface electrode and the thin wire part of the contact part. Consequently, a detail explanation will be omitted except for the different points.

The surface electrode 111 according to the second embodiment includes a circular electrode located directly below the pad electrode 115 and a plurality of thin wire electrodes extending from a center of the circular electrode to an exterior edge of the light emitting element 2 in top view. Further, the circular electrode is not shown in FIG. 4, since it is located directly below the pad electrode 115.

Particularly, the surface electrode 111 includes a thin wire electrode 111*a* disposed in a direction along one diagonal line of the light emitting element 2 formed in almost a square shape in top view, a thin wire electrode 111*c* disposed in a direction along another diagonal line, a thin wire electrode 111*b* disposed along a direction almost parallel to one side of the light emitting element 2 and disposed in a part on a line obtained by connecting almost centers of two sides perpendicular to the one side, and a thin wire electrode 111*d* disposed along a direction perpendicular to the longitudinal direction of the thin wire electrode 111*b*. A point at the intersection of the thin wire electrode 111*a* and the thin wire electrode 111*c* and a point at the intersection of the thin wire electrode 111*b* and the thin wire electrode 111*d* are disposed so as to be approximately coincident with each other. And, lengths of the thin wire electrode 111*a* and the thin wire electrode 111*c* are formed so as to be longer than lengths of the thin wire electrode 111*b* and the thin wire electrode 111*d*. Further, the circular electrode contacts the respective thin wire electrodes 111*a* to 111*d*, and it is disposed in almost the center of the light emitting element 2.

Also, the contact part 122 is disposed, in top view, in an opening located at a part of the transparent layer 140 extruding a region located directly below the surface electrode 111. For example, the contact part 122 includes, in top view, a periphery part 122*a* having a shape along the periphery of the light emitting element 2, and a plurality of expanding parts 122*b* including parts extending in a direction along the one side of the light emitting element 2 and parts extending in a direction along the diagonal line of the light emitting element 2. For example, the expanding parts 122*b* are formed so as to include parts extending in a direction along the thin wire electrode 111*d* and parts extending in a direction along the thin wire electrode 111*a*. Similarly, the expanding parts 122*c* are formed so as to include parts extending in a direction along the thin wire electrode 111*a* and parts extending in a direction along the thin wire electrode 111*b*. Also, in the light emitting element 2 according to the second embodiment, the surface electrode 111 and the contact part 122 are formed so as to satisfy the relationship of the above-mentioned formula described in an explanation of the light emitting element 1 according to the first embodiment.

Third Embodiment

Figure 5:
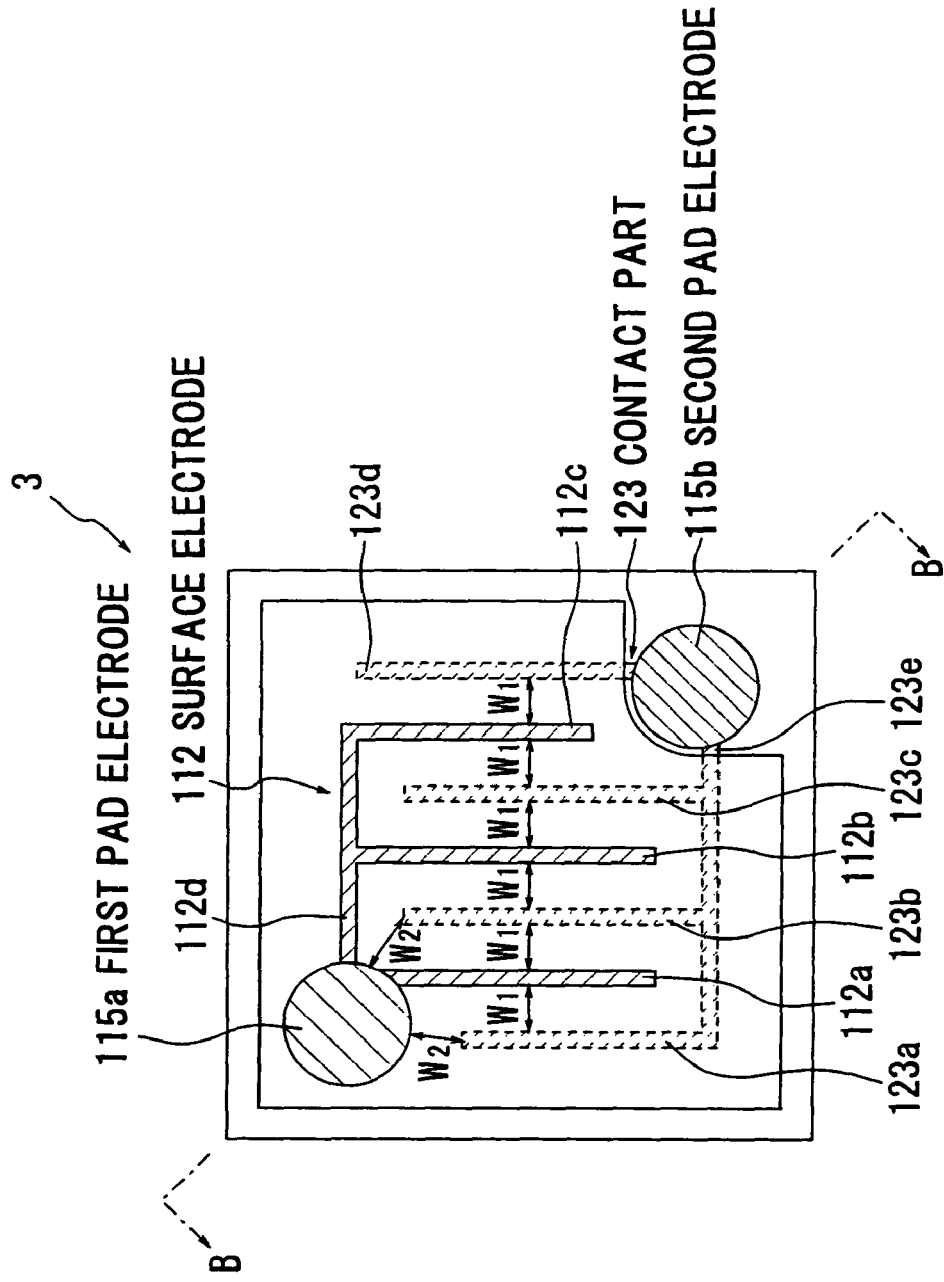
FIG. 5 is a top view schematically showing a light emitting element in a third embodiment according to the invention.
Figure 6:
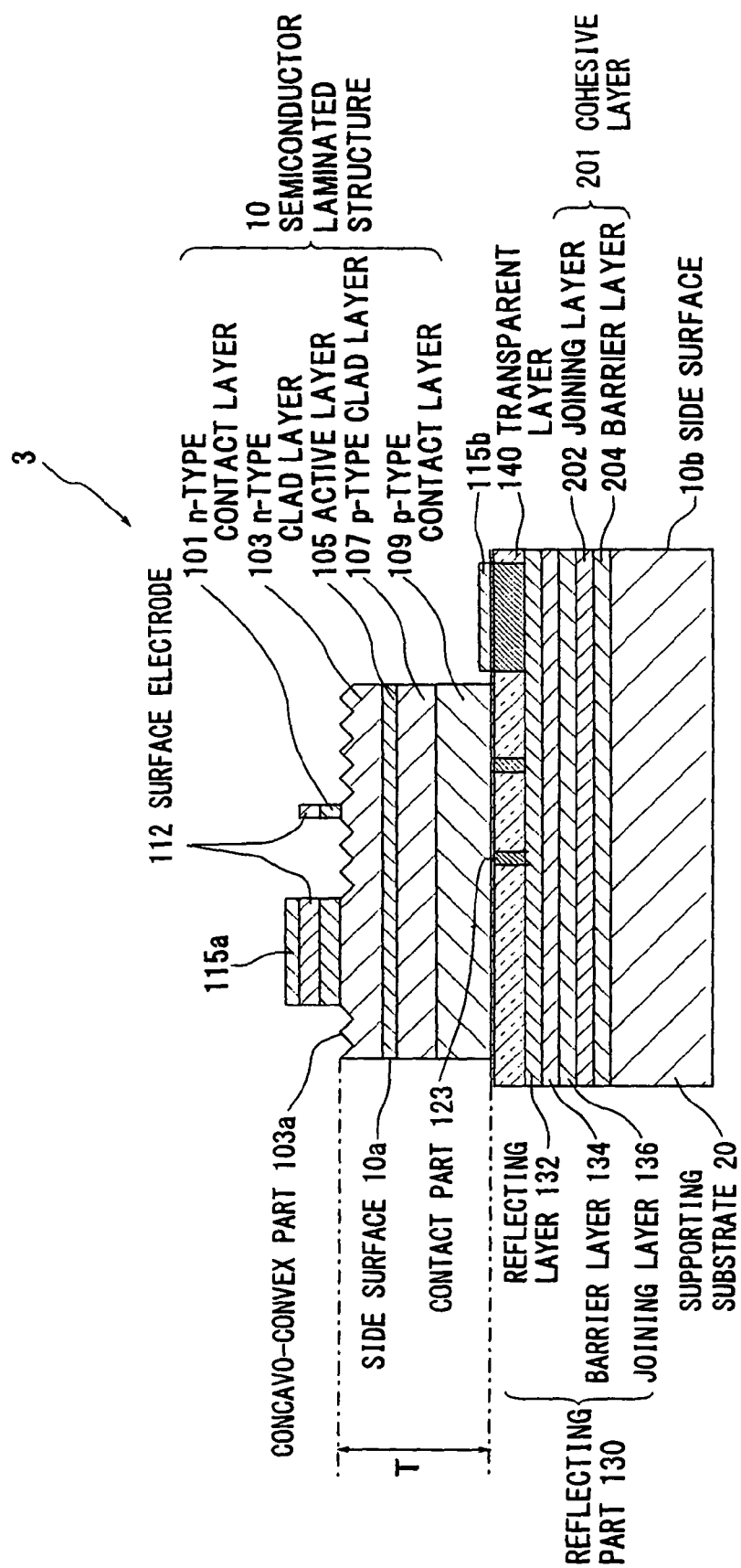
FIG. 6 is a longitudinal cross-sectional view schematically showing the light emitting element in the third embodiment according to the invention.

FIG. 5 is a top view schematically showing a light emitting element in a third embodiment according to the invention, and FIG. 6 is a longitudinal cross-sectional view schematically showing the light emitting element in the third embodiment according to the invention.

A light emitting element 3 according to the third embodiment includes almost the same composition as the light emitting element 1 of the first embodiment except for a different point of supplying electrical current from an upper surface side of the light emitting element 3. Consequently, a detail explanation will be omitted except for the different point.

Referring to FIG. 6, the light emitting element 3 according to the third embodiment includes a semiconductor laminated structure 10, a surface electrode 112 electrically connected to a part of one surface of the semiconductor laminated structure 10, a first pad electrode 115*a* disposed on a partial surface of the surface electrode 112 as a pad for wire bonding, a contact part 123 brought into ohmic contact with a part of another surface of the semiconductor laminated structure 10, a transparent layer 140 disposed so as to contact a part of the another surface of the semiconductor laminated structure 10 excluding a region where a contact part 123 is disposed, and a reflecting part 130 disposed on surfaces of the contact part 123 and the transparent layer 140 opposite to surfaces contacting the semiconductor laminated structure 10. Further, a cohesive layer 201 according to the third embodiment includes a joining layer 202 mechanically connected to the joining layer 136 of the reflecting part 130, and a barrier layer 204 disposed on a surface of the joining layer 202 opposite to a surface contacting the reflecting part 130. Furthermore, the supporting substrate 20 can be also formed of a nonconductive material such as a glass substrate, a sapphire substrate.

Here, the light emitting element 3 has a structure that a part of the semiconductor laminated structure 10 is removed from one surface to another surface of the semiconductor laminated structure 10. And, a second pad electrode 115b as another pad electrode is formed in the contact part 123 corresponding to the region where the semiconductor laminated structure 10 is removed. A surface of the first pad electrode 115a and a surface of the second pad electrode 115b are exposed so as to face in the same direction. Also, the second pad electrode 115b is disposed on a part of the contact part 123 exteriorly exposed at the region where the semiconductor laminated structure 10 is removed. Due to this, electrical current supplied to the second pad electrode 115b is supplied to the semiconductor laminated structure 10 via the contact part 123.

Positional Relationship of Electrodes

As shown in FIG. 5, the surface electrode 112 is formed on the n-type clad layer 103 so as to have a circular electrode formed in almost a circular shape and a plurality of linear electrodes electrically connected to the circular electrode. Further, in FIG. 5, the circular electrode is not shown since it is located directly below the first pad electrode 115a.

The surface electrode 112 is disposed so as to contact the n-type contact layer 101, and for example, it has almost a comb-like shape in top view. As an example, the surface electrode 112 includes a thin wire electrode 112a disposed so as to be adjacent to one side of the light emitting element 3 and to be almost parallel to the one side, a thin wire electrode 112c disposed so as to be adjacent to an opposite side of the one side and to be parallel to the opposite side, and a thin wire electrode 112b located between the thin wire electrode 112a and the thin wire electrode 112c so as to have a distance equal from both of the thin wire electrode 112a and the thin wire electrode 112c.

Further, the surface electrode 112 includes a thin wire electrode 112d extending in a direction almost perpendicular to a longitudinal direction of the respective thin wire electrodes 112a, 112b, 112c and disposed so as to allow the respective thin wire electrodes 112a, 112b, 112c to be connected to each other at end portions of the thin wire electrodes 112a, 112b, 112c, and the circular electrode formed in a place located directly below a region where the first pad electrode 115a is formed. Further, also in the light emitting element 3 according to the third embodiment, the first region of the contact part 123 to the thin wire electrode 112d does not exist. In addition, the thin wire electrodes 112a, 112b are formed so as to have almost the same length, and the thin wire electrode 112c disposed most far away from the first pad electrode 115a is formed so as to have a length shorter than lengths of the thin wire electrode 112a and the thin wire electrode 112b. And, the circular electrode of the surface electrode 112 is disposed at a location including an intersection point of the thin wire electrode 112a and the thin wire electrode 112d.

Also, the contact part 123 is disposed in an opening disposed in the transparent layer 140, and it is disposed in a region excluding a place located directly below the surface electrode 112 according to a shape of the surface electrode 112 in top view. The contact part 123 is disposed so as to have a shape capable of almost uniformly diffusing electrical current to the another surface of the semiconductor laminated structure 10.

For example, the contact part 123 has an almost comb-like shape similarly to the surface electrode 112. As an example, the contact part 123 is disposed so as to be adjacent to one side of the light emitting element 3 in top view, and it includes a linear part 123a almost parallel to the one side, a linear part 123d disposed so as to be adjacent to opposite side of the one side and to be almost parallel to the opposite side, a linear part 123b disposed so as to be more adjacent to the linear part 123a than the linear part 123d, and a linear part 123c disposed so as to be more adjacent to the linear part 123d than the linear part 123a.

Further, the contact part 123 includes a linear part 123e extending in a direction almost perpendicular to a longitudinal direction of the respective linear parts 123a, 123b, 123c, 123d and allowing the linear parts 123a, 123b, 123c, 123d to be electrically connected to each other at end portions of the linear parts 123a, 123b, 123c, 123d, and a circular part located directly below a region where the second pad electrode 115b is disposed. Further, the circular part of the contact part 123 is not shown in FIG. 5, since it is located directly below the second pad electrode 115b.

In addition, the linear part 123a is formed so as to be shorter than the other linear parts, and the linear part 123d is formed so as to be longer than the other linear parts. Also, the linear part 123b and the linear part 123c are formed so as to have almost the same length. And, the linear parts 123a, 123b, 123c, 123d are located at almost the same interval. And, the circular part of the contact part 123 is disposed in a region including an intersection point of the linear part 123d and the linear part 123e, and it is disposed at a diagonal position of the first pad electrode 115a in top view of the light emitting element 3.

Also, in top view, the linear part 123a and the linear part 123b are arranged in a position where the linear electrode 112a is sandwiched. Further, as an example, the first pad electrode 115a and the second pad electrode 115b are formed so as to have a circular shape of 100 μm in diameter, and a plurality of linear electrodes and a plurality of linear parts are formed so as to have a linear shape of 10 μm in width.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting element, comprising:
a semiconductor laminated structure comprising a first semiconductor layer of a first conductivity type, a second semiconductor layer of a second conductivity type different from the first conductivity type, and an active layer sandwiched between the first semiconductor layer and the second semiconductor layer;
a surface electrode comprising a center electrode disposed on one surface of the semiconductor laminated structure and located directly below a pad electrode, and a thin wire electrode extending from a periphery of the center electrode; and
a contact part disposed on a part of another surface of the semiconductor laminated structure extruding a part located directly below the surface electrode, in parallel along the thin wire electrode, and comprising a plurality of first regions forming a shortest current pathway between the thin wire electrode and a second region allowing the plurality of first regions to be connected,
wherein the surface electrode includes an arrangement that a shortest current pathway between the center electrode and the contact part is longer than a shortest current pathway between the thin wire electrode and the first region, and a shortest current pathway between an end part of the thin wire electrode and the contact part is not shorter than the shortest current pathway between the thin wire electrode and the first region.

2. The light emitting element according to claim 1, wherein a square root of a sum of square of a film thickness of the semiconductor laminated structure and a square of a shortest distance between the center electrode and the contact part in a top view is larger than a square root of a sum of square of the film thickness of the semiconductor laminated structure and a square of the shortest distance between the thin wire electrode and the contact part in the top view.

3. The light emitting element according to claim 2, further comprising:
   a supporting substrate comprising a reflecting layer for reflecting a light emitted from the active layer; and
   a transparent layer disposed between the reflecting layer and the semiconductor laminated structure,
   wherein the semiconductor laminated structure is supported by the supporting substrate via the transparent layer, and
   wherein the contact layer passes through the transparent layer and allows the semiconductor laminated structure and the reflecting layer to be electrically connected together.

4. The light emitting element according to claim 3, wherein the semiconductor laminated structure comprises a concavo-convex shape part of not less than 100 nm in an arithmetic average roughness disposed on a part of the one surface thereof.

5. The light emitting element according to claim 4, wherein a part of the semiconductor laminated structure is removed from the one surface to the another surface thereof,
   wherein a part of the contact part is externally exposed due to the removal of the part of the semiconductor laminated structure, and
   wherein another pad electrode is disposed on the part of the contact part externally exposed.

6. The light emitting element according to claim 1, wherein a part of the semiconductor laminated structure is removed from the one surface to the another surface thereof,
   wherein a part of the contact part is externally exposed due to the removal of the part of the semiconductor laminated structure, and
   wherein an other pad electrode is disposed on the part of the contact part externally exposed.

7. The light emitting element according to claim 1, further comprising another pad electrode disposed on an exposed part of the contact part.

8. The light emitting element according to claim 1, further comprising a transparent layer disposed on the another surface of the semiconductor laminated structure,
   wherein the contact part is disposed inside the transparent layer.

9. The light emitting element according to claim 1, wherein an upper surface of the contact part abuts the another surface of the semiconductor laminated structure.

10. The light emitting element according to claim 1, wherein the thin wire electrode comprises a plurality of wire electrodes, and
    wherein the center electrode is located in a region that includes an intersection point of the wire electrodes.

11. The light emitting element according to claim 10, wherein the wire electrodes extend away from the periphery of the center electrode.

\* \* \* \* \*